(12) United States Patent
Yuuki et al.

(10) Patent No.: US 7,474,720 B2
(45) Date of Patent: Jan. 6, 2009

(54) CLOCK AND DATA RECOVERY METHOD AND DIGITAL CIRCUIT FOR THE SAME

(75) Inventors: Fumio Yuuki, Kamifukuoka (JP);
Hiroki Yamashita, Hachioji (JP);
Masahito Sonehara, Koganei (JP)

(73) Assignee: Hitachi, Ltd., Tokyo (JP)

( * ) Notice: Subject to any disclaimer, the term of this patent is extended or adjusted under 35 U.S.C. 154(b) by 641 days.

(21) Appl. No.: 10/722,484

(22) Filed: Nov. 28, 2003

(65) Prior Publication Data

US 2004/0114632 A1 Jun. 17, 2004

(30) Foreign Application Priority Data

Nov. 29, 2002 (JP) ............................. 2002-346767

(51) Int. Cl.
*H04L 7/00* (2006.01)
*H04J 3/06* (2006.01)
(52) U.S. Cl. .................... 375/354; 375/355; 370/503
(58) Field of Classification Search ................ 375/354, 375/355, 356, 374, 375, 373; 365/233; 370/503, 370/395.62; 398/155; 713/400
See application file for complete search history.

(56) References Cited

U.S. PATENT DOCUMENTS

| 4,808,884 A | * | 2/1989 | Hull et al. .................... 375/376 |
| 5,400,370 A | * | 3/1995 | Guo ............................ 375/371 |
| 5,451,894 A | * | 9/1995 | Guo ............................ 327/241 |
| 5,592,125 A | * | 1/1997 | Williams ..................... 331/1 A |

(Continued)

FOREIGN PATENT DOCUMENTS

JP 59-63834 4/1984

(Continued)

OTHER PUBLICATIONS

Miki et al., A 50-mW/ch 2.5-Gb/s/ch Data Recovery Circuit for the SFI-5 Interface With Digital Eye-Tracking Apr. 2004, IEEE Journal of Solid-State Circuits, vol. 39, Issue 4, pp. 613-621.*

(Continued)

*Primary Examiner*—Mohammad H Ghayour
*Assistant Examiner*—Lawrence Williams
(74) *Attorney, Agent, or Firm*—Antonelli, Terry, Stout & Kraus, LLP.

(57) ABSTRACT

A clock data recovery circuit has a good jitter tolerance characteristic and a broad data recovery range in the event of a wander, that is, a good wander-tracking characteristic of a recovered clock signal. The clock data recovery circuit executes control to compare the position of the edge of data with the position of the edge of a data recovery clock signal (a recovered clock signal) and keeps the clock edge away from the data edge if a gap between the edges becomes smaller than a reference value. A cycle of a reference clock signal is divided into N portions to generate N clock signals (pl ) with phases different from each other in composition circuits. By executing control to turn on 2 of the N selector control signals supplied to each 2 adjacent pins of the N−1 selectors at the same time, the N−1 selectors are capable of generating a middle phase between first and second phases and, hence, generating one of N×2 phases from N input phases as the phase of the data recovery clock signal.

5 Claims, 28 Drawing Sheets

U.S. PATENT DOCUMENTS

| | | |
|---|---|---|
| 6,285,726 B1 * | 9/2001 | Gaudet ........................ 375/376 |
| 6,466,098 B2 | 10/2002 | Pickering |
| 6,584,163 B1 * | 6/2003 | Myers et al. ................. 375/360 |
| 6,614,314 B2 * | 9/2003 | d'Haene et al. ............. 331/1 A |
| 6,888,905 B1 * | 5/2005 | Cheah et al. ................. 375/355 |
| 6,901,126 B1 * | 5/2005 | Gu .............................. 375/355 |
| 7,020,227 B1 * | 3/2006 | Wang et al. .................. 375/355 |
| 7,120,216 B2 * | 10/2006 | Shirota et al. ............... 375/373 |
| 2002/0085656 A1 * | 7/2002 | Lee et al. ..................... 375/355 |
| 2003/0086339 A1 * | 5/2003 | Dally et al. .................. 368/202 |
| 2003/0215043 A1 * | 11/2003 | Ibukuro et al. .............. 375/376 |
| 2004/0052152 A1 * | 3/2004 | Kono ........................ 365/233 |

FOREIGN PATENT DOCUMENTS

| | | |
|---|---|---|
| JP | 59-171233 | 9/1984 |
| JP | 2001-230765 | 8/2001 |

OTHER PUBLICATIONS

Saito et al., A 50-mW/ch 2.5-Gb/s/ch Data Recovery Circuit for the SFI-5 Interface Using a Novel Eye-Tracking Method, Jun. 12-14, 2003, VSLI Circuits, 2003, Digest of Digital Papers 2003 Symposium on, ournal of Solid-State Circuits, pp. 57-60.*

2000 IEEE International Solid-State Circuits Conference TP 15.7 A 20 Gb/s CMOS Multi-Channel Transmitter and Receiver Chip Set for Ultra-High Resolution Digital Display.

2001 IEEE International Solid-State Circuits Conference 4.4 "5Gb/s Bidirectional Balanced-Line Link Complaint With Piesiochronous Clocking".

* cited by examiner 8-1 SELECTOR CIRCUIT

CLOCK PHASE SELECT SIGNALS S0 TO S7

○: DIFFERENTIAL SMALL AMPLITUDE (1.3v/1.8v)
⊘: CMOS LEVEL (0v/1.8v)

CONFIGURATION OF CLOCK DATA RECOVERY CIRCUIT ADOPTING DATA DELAY METHOD IN ACCORDANCE WITH FOURTH EMBODIMENT

BLOCK DIAGRAM OF COMPARATIVE EXAMPLE OF VCO TYPE

Ta: PHASE DETECTION PERIOD IN THE CONVENTIONAL SYSTEM, THAT IS, TIME IT TAKES TO REACH A COUNT OF N

LOOP DELAY IN THE PRESENT INVENTION, THAT IS, A PERIOD BETWEEN REFLECTION OF A PHASE COMPARISON RESULT AND PHASE COMPARISON

Tb: WANDER FOR PERIOD Ta

CLOCK AND DATA RECOVERY METHOD AND DIGITAL CIRCUIT FOR THE SAME

FIELD OF THE INVENTION

The present invention relates to a digital clock/data recovery circuit that has a good jitter/wander-tolerance characteristic as well as allows its size and its power consumption to be reduced with ease.

BACKGROUND OF THE INVENTION

With a remarkably increasing number of data communication services due to, among others, the popularization of the Internet in recent years, an optical transmission system using optical fibers is applied to mainly trunk networks in a wide range of networks up to metro networks. Nowadays, it is time to implement production of a 10-Gbps optical transmission system for trunk networks on a full scale. In addition, development of a communication LSI for a next-generation optical transmission system with a transmission speed of 40 Gps has been started. So far, in an interface of a Framer IC for an optical transmission module, there has been adopted a transmission system for transmitting data and a clock signal in parallel.

Non-patent references 1 and 2 each disclose a typical transmission system. Non-patent reference 1 is a document with a title of "A 20 Gb/s CMOS Multi-Channel Transmitter and Receiver Chip Set for Ultra-High Resolution Digital Display," 2000 IEEE International Solid-State Circuits Conference TP 15.7. On the other hand, non-patent reference 2 is a document with a title of "5 Gb/s Bidirectional Balanced-Line Link Compliant with Plesiochronous Clocking," 2001 IEEE International Solid-State Circuits Conference 4.4. The inventors of the present invention have studied conventional technologies disclosed in documents including non-patent reference 1 and pointed out technological problems as a result of the study. By referring to diagrams, the following description sequentially explains the conventional technologies and their problems.

FIG. 16 is a block diagram showing an optical transmission module developed by the inventors and serving as a prerequisite to the present invention. FIG. 17 is a block diagram showing an SFI-5 Rx LSI employed in the optical transmission module shown in FIG. 16.

In a 40 Gbps optical transmission module shown in FIG. 16 as a next-generation optical transmission module employing an SFI-5 Rx LSI shown in FIG. 17, an interface unit processes signals each having a large number of bits and a high frequency. For the large number of bits and the high frequency, there has been proposed interface specifications SFI-5 with a CDR (Clock and Data Recovery) system used as a prerequisite. The CDR system is a system for extracting a clock signal from data. A CDR block employed in the SFI-5 Rx LSI shown in FIG. 17 extracts a clock signal from data and receives the data. A FIFO block absorbs clock skews generated between channels. The function of the FIFO blocks is indispensable to a high-speed I/F LSI.

FIG. 18 is a block diagram showing a typical configuration of a CDR (Clock and Data Recovery) circuit employing a commonly known VCO (Voltage-Controlled Oscillator). The inventors of the present invention developed the CDR circuit. In the CDR circuit, a phase comparator generates UP and DOWN signals as a result of phase comparison. Electric charge representing a difference between the UP and DOWN signals is accumulated in a charge pump 1801. A loop filter 1802 removes high-frequency components from the voltage of a capacitor employed in the charge pump 1801 before the voltage is supplied to an oscillator 1803. Since the loop filter 1802 must employ a capacitor with a large capacitance of the order of 100 pF in this configuration, the configuration has a shortcoming that it is necessary to increase the area of the CDR circuit to about 500 square-microns. Thus, the CDR circuit is not suitable for bit-count enhancement of an optical transmission system.

FIG. 19 is a block diagram showing the configuration of a variable delay type phase generator adopted in a CDR circuit serving as a comparison example assumed by the inventors of the present invention. The figure is given to show problems to be solved by the present invention. The configuration comprises a phase comparator 1903, a counter 1905 and a clock-phase generation unit 1906. The phase comparator 1903 is a component for comparing the phase of input data 1901 with the phases of data recovery clock signals 1902 generated internally. As a result of comparison, the phase comparator 1903 outputs UP and DOWN signals 1904 indicating directions of the change of the clock phase. The counter 1905 is a component for controlling the frequency at which the UP and DOWN signals 1904 are fed back to a means for outputting a clock phase. The clock-phase generation unit 1906 is a component for generating the output phases of the clock signals from a signal output by the counter 1905. The clock-phase generation unit 1906 comprises a phase interpolation control unit 1907 and 2 phase interpolation circuits 1908.

The phase interpolation circuits 1908 are each connected to a load resistor having 2 common left and right differential pairs. If 2 clock signals with phases different from each other by 90 degrees are supplied to the left and right differential pairs respectively, a signal having a mid phase between the 2 phases is output. By controlling a current source of the differential pairs, the mid phase can be generated as a staircase like phase. Let symbols θ and f denote the phases of the signals supplied to the left and right differential pairs and combinations of the phases θ and f be the following 4 combinations, i. e., a combination of 0 degrees and 90 degrees, a combination of 90 degrees and 180 degrees, a combination of 180 degrees and 270 degrees and a combination of 270 degrees and 0 degrees. In this case, by controlling a current generated by the current source to magnitudes I0 to I16, the output phase can be changed to values at 64 (=16 stages×4, where the integer 4 is the number of phase combinations) stages. The 16 stages correspond to the 16 current magnitudes I0 to I16.

FIG. 20 shows a flowchart representing operations carried out by the CDR circuit shown in FIG. 19. First of all, a phase comparator compares data 2001 with the edge of a clock signal 2002 generated internally. If the phase of the clock signal lags behind the phase of the data, the comparator outputs the UP signal 2003. If the phase of the clock signal leads ahead of the phase of the data, on the other hand, the comparator outputs the DOWN signal 2004. A counter counts the number of UP signals 2003 and the number of DOWN 2004. As the number of UP signals 2003 or the number of DOWN 2004 reaches a number N, the counter outputs a signal to the clock generation unit 2005, which generates the aforementioned clock signal 2002 on the basis of the UP and DOWN signals.

FIG. 21 is a diagram showing an outline of operations carried out by the CDR circuit shown in FIG. 19. A time-to-time processing method is adopted as the conventional processing method for reflecting results of the edge detection in the recovered clock signal. A cycle from edge detection to reflection of phase-comparison results in a recovered clock signal is divided into a phase detection period from the phase comparison in the phase comparator to an operation carried out by the counter to output a signal, a clock-phase selection process and a clock delay, which is a delay incurred by the recovered clock signal. In accordance with the time-to-time processing method, before a cycle up to reflection of edge detection results in a recovered clock signal is completed, the next cycle is started in order to reduce a clock control interval. In this way, phases can be detected and results of the phase detection can be fed back with a higher degree of precision.

FIG. 22 shows typical timing charts of operations carried out by the CDR circuit shown in FIG. 19. As a method of further reducing the clock control interval, there is a method in which a dual counter is employed for carrying out process A and process B concurrently. Of course, there is also a method of using a single counter for processing process A only.

The description begins with a state in which clock signal 3 has been selected as an initial recovered clock signal. Since the rising edge of the recovered clock signal leads ahead of the rising edge of the data, in phase detection (1) of process A, the number of DOWN_A pulses is counted. The output of the counter is fed back to phase-selection and clock-outputting processes and, as N DOWN_A pulses are counted, the recovered clock signal is switched to clock signal 2. In addition, process B is being carried out concurrently with process A and, from the same processing as that described above, clock signal 2 is selected. In the continuation of process A, data edges are moving due to a wander, causing the raising edge of the recovered clock signal to lag behind the data edge. For this state, before results of phase detection (1) are reflected, N UP_A pulses are counted during phase detection (3), and the phase-selection and clock-outputting processes switch the recovered clock signal to clock signal 3.

FIG. 23 is a diagram showing basic operations carried out by the CDR circuit shown in FIG. 19. If a rising edge of data exists in edge detection width A between rising edge 2 of recovered clock signal 2 and rising edge 3 of recovered clock signal 3, the clock signal is shifted in the plus direction by a phase differential of T/N. If a rising edge of data exists in edge detection width B between rising edge 2 of recovered clock signal 2 and rising edge 1 of recovered clock signal 1, on the other hand, the clock signal is shifted in the minus direction by a phase differential of T/N. Data is taken in and output on a falling edge of a clock signal.

FIG. 24 is a diagram showing an edge detection method (that is, an edge-tracking method) adopted by the CDR circuit shown in FIG. 19. The following description explains a process to take in data in edge detection for data having jitters. As the jitters, a value of 0.7 UI is taken into consideration. The value of 0.7 UI is a result of adding a jitter increase of 0.025 UI caused by the I/O to a standard value of 0.675 UI. This standard value is an SFI-5 (Serdes Framer Interface Level 5) standard value.

With clock timing 1, the phase of the clock signal is compared with the phase of data by comparing the rising edge of the clock signal with the rising edge of a data pulse far way from an eye. In the case of clock timing 1, the falling edge of the clock signal is shifted to a position outside the eye serving as a data recovery width, existing in the 0.7 UI jitter range. Thus, if the fact that data jitters deviate from D0 to Dn is taken into consideration, at Dn, for example, it is quite within the bounds of possibility that the data preceding Dn by 1 cycle is output. With clock timing 2, on the other hand, the phase of the clock signal is compared with the phase of data by comparing the rising edge of the clock signal with the rising edge of a data pulse close to the eye serving as a data recovery width. Also in the case of clock timing 2, the falling edge of the clock signal is shifted to a position outside the eye serving as a data recovery width, existing in the 0.7 UI jitter range. Thus, if the fact that data jitters deviate from D0 to Dn is taken into consideration, at D0, for example, it is quite within the bounds of possibility that the data succeeding D0 by 1 cycle is output.

FIG. 25 is a diagram showing the definition of a wander, which is a long-period phase deviation. A wander prescribed in the SFI-5 standard is defined as attributes of a sinusoidal signal with a P-P amplitude of 10.65 UI and a period Tw in the range 5.3 to 6.7 micron sec. FIG. 26 is a diagram showing a characteristic representing the dependence of the wander Tb on the phase detection period Ta. For a counter count value of 8 in the conventional CDR circuit, the wander Tb is found to be 5.2 ps for a phase detection period Ta of 8 UI. If the frequency of the signal supplied to the counter is divided, the wander Tb is found to be 10.4 ps for a phase detection period Ta of 16 UI.

FIG. 27 is a diagram showing relations between the eye and clock jitters with a wander generated in the CDR circuit shown in FIG. 19. Prior to generation of a wander, a clock falling edge may exist at a position of several ps up to a jitter range within an eye. Thus, data D0 to Dn can correctly be output. In the case of a wander changing during the conventional detection period, on the other hand, the data edge deviates with a wander Tb of to 10 ps. Thus, the clock falling edge is shifted to a position outside the eye, existing in the 0.7 UI jitter range. As a result, at Dn, for example, it is quite within the bounds of possibility that the data preceding Dn by 1 cycle is output.

In the typical edge detection described above, it is quite within the bounds of possibility that, due to a wander, data taken in at a clock immediately preceding the feedback of the edge detection may be data succeeding the supposed data by 1 cycle. In addition, since a wander reduces the width of data recovery, it is necessary to decrease Tb (wander/phase detection period).

FIG. 28 is a diagram showing a relation between the data edge and the edge detection width with a wander generated in the CDR circuit shown in FIG. 19. In the conventional CDR circuit, after N results of phase comparison are counted, a recovered clock signal is generated. While a data edge at the first edge detection exists in the edge detection width, at the Nth edge detection shown in the figure, the data edge is shifted to a position outside the edge detection width due to a wander Tb. Thus, since a result of phase comparison cannot be output, N results of phase comparison cannot be counted so that neither a recovered clock signal is generated nor the phase changes.

As described above, in this typical edge detection, the phase of data with an edge supposed to be in edge detection width A deviates by a quantity Tb during a phase detection period due to a wander so that the edge is shifted to a position outside the edge detection width. Thus, results of phase comparison cannot be counted and the phase does not change. It is therefore feared that the clock edge does not follow the data edge. In addition, data may not be taken in correctly in dependence on the quantity Tb of the wander. It is thus quite within the bounds of possibility that data succeeding the supposed data by 1 cycle is output.

As described above in detail, the conventional clock data recovery circuit has the following problems:

(1) The configuration of the conventional clock data recovery circuit does not include sufficient consideration of an edge detection method for data with a jitter width exceeding 0.5 UI. That is to say, let data with a jitter width exceeding 0.5 UI be handled by adoption of an edge detection technique based on an edge-tracking method. In this case, if the phase of a data edge on the eye side is compared with the phase of a clock rising edge, an edge for recovery of data on the clock falling edge is shifted out from the data recovery width. As a result, the data cannot be recovered correctly. In other words, the edge-tracking method can correctly recovery only data with a jitter width of about 0.5 UI or below.

As is obvious from the above description, the clock data recovery circuit described above has a problem of a poor jitter-tolerance characteristic.

(2) The configuration of the conventional clock data recovery circuit does not include sufficient consideration of an edge detection method for correctly recovering data even in the event of a wander. That is to say, since a clock falling edge may exist at a position of several ps up to a jitter range within the eye prior to generation of a wander, if a wander is generated in the jitter direction, the clock falling edge will be shifted to a position in the jitter range so that data cannot be recovered.

As is obvious from the above description, the clock data recovery circuit described above has a problem of a narrow data recoverability range with a wander taken into consideration.

(3) The configuration of the conventional clock data recovery circuit does not include sufficient consideration of an edge detection method for placing a data edge in an edge detection width even in the event of a wander. That is to say, at the first edge detection in a phase detection period, a data edge may exist at a position on the inner side several ps from the edge of the edge detection width. At the Nth edge detection, since the data edge deviates due to a wander Tb, it is quite within the bounds of possibility that the data edge is shifted to a position outside the edge detection width. In other words, since results of phase comparison cannot be output, N results cannot be counted so that neither a recovered clock signal is generated nor the phase is changed.

As is obvious from the above description, the clock data recovery circuit described above has a problem that the clock signal has a poor tracking characteristic in the event of a wander.

(4) The configuration of the conventional clock data recovery circuit does not include sufficient consideration of reduction of power consumption by the phase interpolation circuit. That is to say, the current of the phase interpolation circuit is controlled to magnitudes separated away at intervals each equal to a current pitch of I1 mA. To put it concretely, the magnitudes of the currents I0 to I16 are set as follows: I0=0 mA, I1=the magnitude of a circuit operation limit current [mA] and I16=I1×16 mA. That is to say, the phase selection causes a current always having a magnitude equal to 16 times the circuit operation limit current to flow.

As is obvious from the above description, the clock data recovery circuit described above has a problem of large power consumption.

It is thus a first object of the present invention addressing the problem described in section (1) to provide a clock data recovery circuit having an improved jitter tolerance characteristic.

It is thus a second object of the present invention addressing the problem described in section (2) to provide a clock data recovery circuit having a broadened data recoverability range to cope with a wander generated in the clock data recovery circuit.

It is thus a third object of the present invention addressing the problem described in section (3) to provide a clock data recovery circuit having an improved tracking characteristic to cope with a wander generated in the clock data recovery circuit.

It is thus a fourth object of the present invention addressing the problem described in section (4) to provide a clock data recovery circuit having a reduced power consumption.

SUMMARY OF THE INVENTION

In order to achieve the first object described above, the present invention is provided with a function to compare the position of an edge of data with the position of an edge of a data recovery clock signal and to keep away the edge of the data recovery clock signal from the edge of the data if the difference in edge position between the data and the data recovery clock signal is smaller than a reference value and a function to divide a cycle of a reference clock signal into N portions in order to generate clock signals having N phases different from each other, to select one of the N phases and take the clock signal with the selected phase as the data recovery clock signal. In the following description, the data recovery clock signal is also referred to simply as a recovered clock signal.

In addition, the present invention also has a function to compare the position of an edge of data with the position of an edge of a data recovery clock signal, execute control to position the edge of the data recovery clock signal in an eye narrowed by high-frequency phase deviations (or jitters) of the data and take in the data with a timing of the compared edge of the data recovery clock signal.

Furthermore, the present invention comprises: a phase comparator for comparing the phase of input data with the phase of a data recovery clock signal generated internally and outputting shift directions of the phase of the data recovery clock signal as UP and DOWN signals; a counter for controlling a frequency at which the UP and DOWN signals are fed back to a means for determining the phase of the data recovery clock signal; a cyclic clock-phase pointer for controlling an output phase of the data recovery clock signal on the basis of OUT UP and OUT DOWN signals output by the counter; and a phase variable-delay circuit for outputting a clock phase according to a phase control signal. In the clock data recovery circuit, the data recovery clock signal is taken in from the input data and the input data is taken in with a timing determined by the recovered clock signal.

A further clock data recovery circuit comprises:

a counter for controlling a frequency at which UP and DOWN signals are fed back to a means for determining the phase of the data recovery clock signal; a cyclic clock-phase pointer for controlling an output phase of the data recovery clock signal on the basis of OUT UP and OUT DOWN signals output by the counter; and a phase variable-delay circuit for outputting a clock phase according to a phase control signal. In this clock data recovery circuit, a cycle of a reference clock signal is divided into N portions to generate N clock signals with phases different from each other. Then, the phase variable-delay circuit selects one of the N generated clock signals as the data recovery clock signal. The selected clock signal has one of the phases, which is selected by the cyclic clock-phase pointer.

In addition, the clock data recovery circuit has a function to select one phase to be output by the phase variable-delay circuit. The phase is selected on the basis of a plurality of results of phase detection carried out over a plurality of cycles having a phase-switching pitch Tp smaller than a value determined by the cyclic clock-phase pointer.

In order to achieve the second and third objects described above, the present invention is provided with a function for comparing the position of the edge of data with the position of the edge of a data recovery clock signal (or a recovered clock signal) and keeping the clock edge away from the data edge if a gap between the edges becomes smaller than a reference value; and a function of dividing a cycle of a reference clock signal into N portions to generate N clock signals with phases different from each other and selecting one of the N generated clock signals as a data recovery clock signal.

In addition, from another point of view of the present invention, there is provided a clock data recovery circuit having a function to track a wander, which is a long period phase deviation of input data, by comparing the position of the edge of the input data with the position of the edge of the clock signal.

Even for input data with a long period phase deviation, the function to track a wander (which is the long period phase deviation of the input data) by comparing the position of the edge of the input data with the position of the edge of the data recovery clock signal is executed under a condition expressed by a relation given as follows:

$$B \times \sin(2p \times Ta/Tw) < T/N$$

where symbol B denotes a maximum phase change of said input data over a long period of time, symbol Ta denotes a loop delay, symbol Tw denotes a phase deviation period, symbol T denotes a clock period, symbol N denotes the number of phase divisions, and T/N denotes a difference between 2 adjacent phases determined by said number of phase divisions N. As described earlier, the loop delay Ta is a period of time between an output operation carried out by a phase comparator and an operation to reflect a selected phase in a clock signal supplied to the phase comparator.

In addition, there is also provided a function to select one phase to be output by the phase variable-delay circuit on the basis of a plurality of results of phase detection carried out over a plurality of cycles having a phase-switching pitch Tp smaller than a value determined by the cyclic clock-phase pointer.

In order to achieve the fourth object described above, the phase variable-delay circuit of the present invention is provided with buffers, composition circuits, N–1 selectors and CMOS level conversion circuits. The buffers, the composition circuits and the N–1 selectors are each designed as a small-amplitude differential circuit.

By executing control to turn on 2 of the N–1 selector control signals supplied to each 2 adjacent pins of the N–1 selectors at the same time, the N–1 selectors are capable of generating a middle phase between first and second phases and, hence, generating one of N×2 phases from N input phases.

A data recovery method provided by the present invention is a data recovery method for generating a recovered clock signal by using input data and taking in the input data on the basis of a timing determined by the recovered clock. The data recovery method is characterized in that the method comprises the steps of: comparing the position of the edge of data with the position of the edge of a data recovery clock signal (or the recovered clock signal) and keeping the clock edge away from the data edge if a gap between the edges becomes smaller than a reference value; and dividing a cycle of a reference clock signal into N portions to generate N clock signals with phases different from each other and selecting one of the N generated clock signals as a data recovery clock signal.

In addition, the clock data recovery circuit provided by the present invention is characterized by comprising: a phase comparator for comparing the phase of input data with the phase of a data recovery clock signal generated internally and outputting shift directions of the phase of the data recovery clock signal as UP and DOWN signals; a counter for controlling a frequency at which the UP and DOWN signals are fed back to a means for determining the phase of the data recovery clock signal; a cyclic clock-phase pointer for controlling an output phase of the data recovery clock signal on the basis of OUT UP and OUT DOWN signals output by the counter; and a phase variable-delay circuit for outputting a clock phase according to a phase control signal, wherein the input data is taken in with a timing determined by the data recovery clock signal.

The phase variable-delay circuit changes the clock phase output thereby as the phase of the data recovery clock signal so as to keep the edge of the data recovery clock signal away from the edge of the input data. In addition, a cycle of a reference clock signal may be divided into N portions to generate N clock signals with phases different from each other. Then, the phase variable-delay circuit selects one of the N generated clock signals as the data recovery clock signal. The selected clock signal has one of the phases, which is selected in accordance with the phase control signal. The phase variable-delay circuit may select a clock phase on the basis of a plurality of results of phase detection carried out over a plurality of cycles having a phase-switching pitch Tp smaller than a value determined by the cyclic clock-phase pointer.

In addition, the phase variable-delay circuit of the present invention may have buffers, composition circuits, N–1 selectors and CMOS level conversion circuits wherein the buffers, the composition circuits and the N–1 selectors are each designed as a small-amplitude differential circuit.

From another point of view of the present invention, the present invention is characterized by including a control circuit for executing control so as to place the edge of a data recovery clock signal in an eye narrowed by jitters, which are high-frequency components of data, by comparing the position of the edge of the data recovery clock signal with the position of the edge of the data, wherein the data is then taken in with a timing of the edge of the data recovery clock signal. Thus, the control circuit executes control so that the distance between the position of the edge of the data recovery clock signal and the position of the edge of the data does not become smaller than a predetermined value. That is to say, the control circuit is capable of executing control so as to place the edge of the data recovery clock signal in an eye narrowed by jitters, which are high-frequency components of data as described above.

In addition, the control circuit is capable of comparing the position of the edge of the data recovery clock signal with the position of the edge of the data at a first predetermined frequency and changing the phase of the data recovery clock signal at a second predetermined frequency not exceeding the first predetermined frequency. For example, by reflecting a plurality of edge-gap values sampled at a high frequency, the phase of the data recovery clock signal is changed at a frequency lower than the high frequency in order to control the gap between the position of the edge of the data recovery clock signal and the position of the edge of the data. By executing control in this way, it is possible to execute control of the edge position with a high degree of precision by using a simple circuit.

DETAILED DESCRIPTION OF THE PREFERRED EMBODIMENTS

Figure 1:
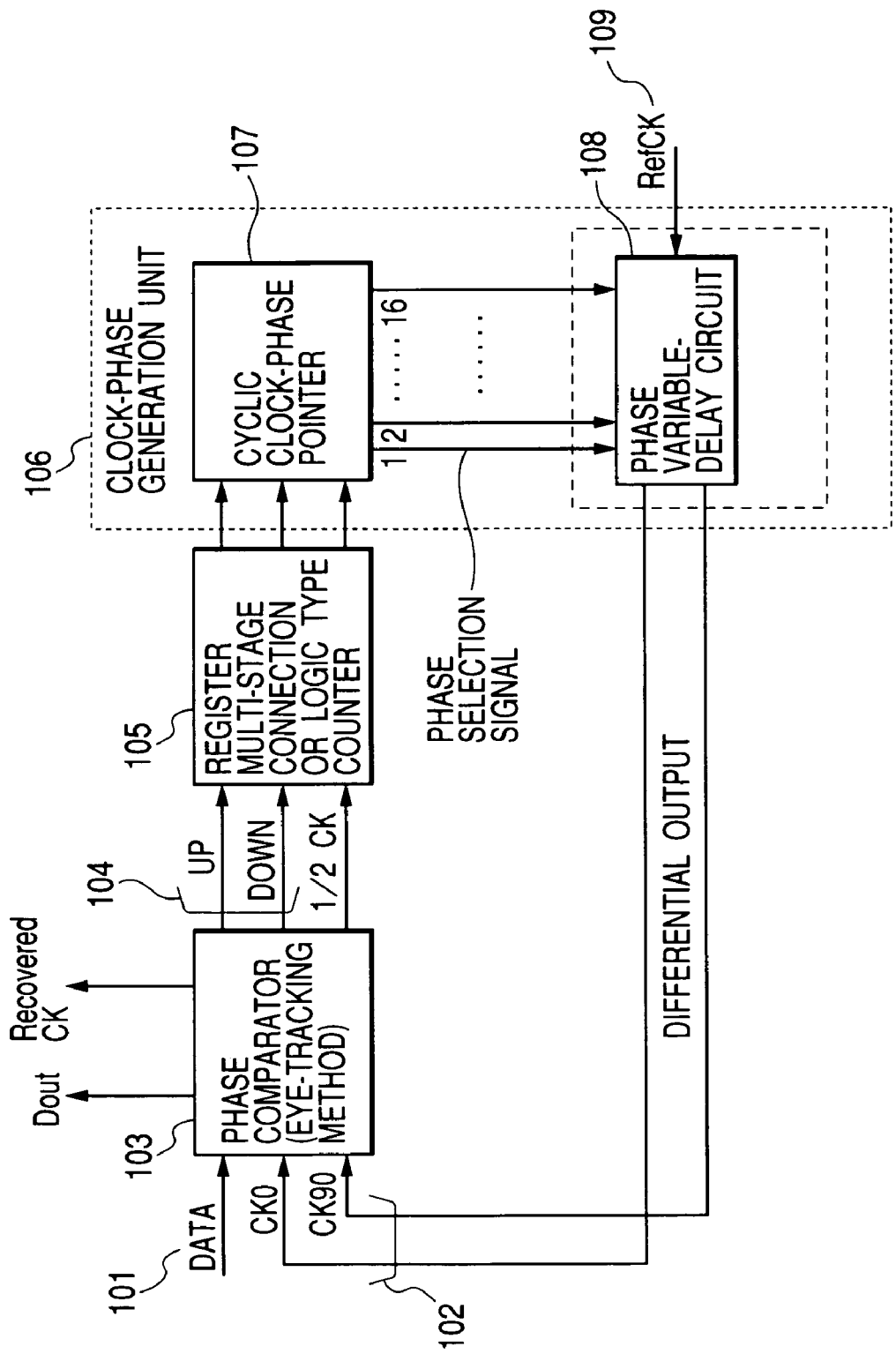
FIG. 1 is a block diagram showing the configuration of a digital-control type clock data recovery circuit implemented by a first embodiment of the present invention.

Preferred embodiments of the present invention will be described below by referring to the drawings.

FIG. 1 is a block diagram showing the configuration of a digital-control type clock data recovery circuit implemented by a first embodiment of the present invention. The digital-control type clock data recovery circuit is also referred to hereafter simply as a digital clock data recovery circuit.

As shown in FIG. 1, the digital clock data recovery circuit comprises: a phase comparator 103 for comparing the phase of input data 101 with the phase of a data recovery clock signal 102 generated internally and outputting shift directions of the phase of the data recovery clock signal 102 as UP and DOWN signals 104; a register multi-stage connection OR logic type counter 105 for controlling a frequency at which the UP and DOWN signals 104 are fed back to a means for determining the phase of the data recovery clock signal 102; and a clock-phase generation unit 106 for generating an output phase of the data recovery clock signal on the basis of signals output by the counter 105.

The clock-phase generation unit 106 comprises a cyclic clock-phase pointer 107 and a digital-control type phase variable-delay circuit 108.

The phase variable-delay circuit 108 is a circuit for dividing one cycle of a reference clock signal 109 into N portions in order to generate N clock signals with phases different from each other, selecting one of the phases and taking one of the N clock signals, which has the selected phase, as the data recovery clock signal 102. The phase variable-delay circuit 108 is a digitally controlled circuit employing a selector for selecting one of N (=16) phases.

The phase comparator 103 receives the data recovery clock signal 102 output by the phase variable-delay circuit 108 and compares the phase of the data recovery clock signal 102 with the phase of the input data 101, outputting a result of the comparison as the UP or DOWN signal 104. The UP or DOWN signal 104 is fed back to the clock-phase generation circuit 106 eventually so as to execute control of keeping the edge of the output data recovery clock signal 102 away from edge of the input data 101.

The register multi-stage connection OR logic type counter 105 carries out an OR logic process on the UP and DOWN signals 104 detected over a plurality of cycles to improve detection precision and generates an interrupt for every 16 cycles. Thus, while the conventional clock data recovery circuit counts the number of UP or DOWN signals, the clock data recovery circuit provided by the present invention counts 16 clock pulses before feeding back the UP and DOWN signals 104 to the clock-phase generation circuit 106.

Figure 2:
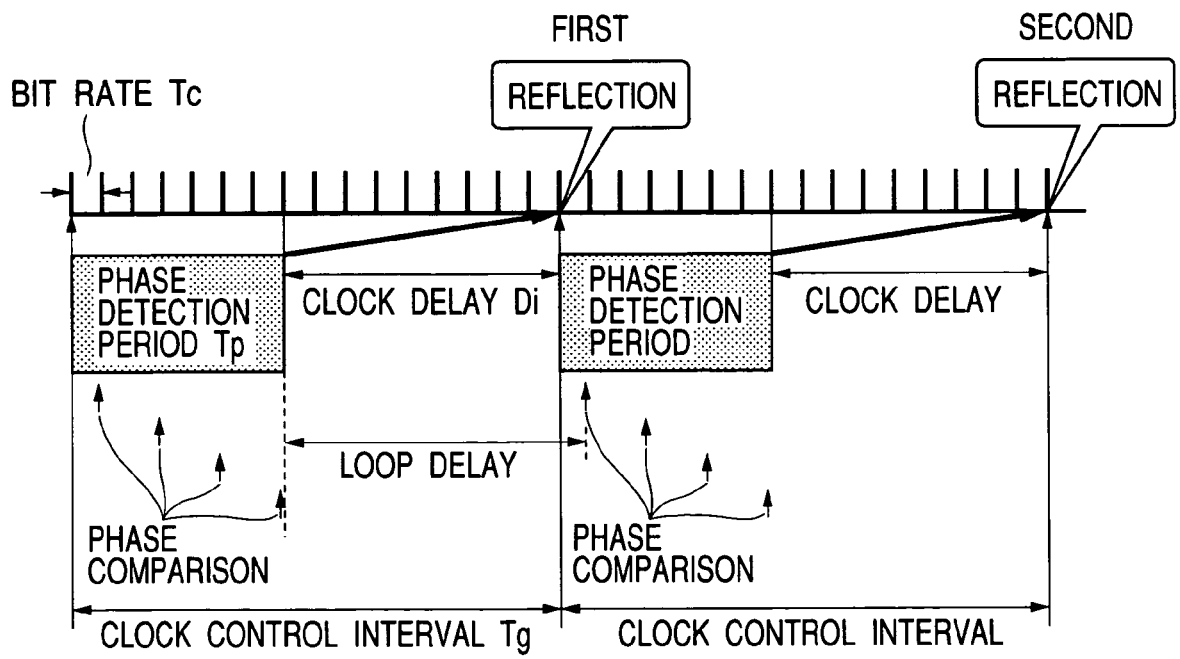
FIG. 2 is a diagram showing an outline of operations carried out by the first embodiment of the present invention.

FIG. 2 is a diagram showing an outline of operations carried out by the first embodiment implementing phase-reflect control (adopting a successive processing method) provided by the present invention. In typical processing, an OR logic process is carried out on the UP and DOWN signals 104 detected over a plurality of cycles and the UP and DOWN signals reflecting results of processing are forwarded to control the phase of the data recovery clock signal 102.

This embodiment adopts a successive processing technique in a processing method to reflect results of phase comparison in the recovered clock signal. A cycle from phase detection to reflection of phase-comparison results in a recovered clock signal is divided into a phase detection period from the phase comparison to an operation carried out by the counter 105 to output a signal, a clock-phase selection process and a clock delay, which is a delay incurred by the recovered clock signal. In accordance with the successive processing method, after a cycle just before reflection of a phase-comparison result is completed, the process of the next cycle is started in order to suppress the number of reflections per phase detection to 1. In addition, the process of the next cycle is started in order to set a phase-switching change quantity at a large value by decreasing the size of a clock phase division to a value smaller than the size of the clock phase division for the conventional clock data recovery circuit for the purpose of improving the wander/jitter tolerance characteristic.

Figure 3:
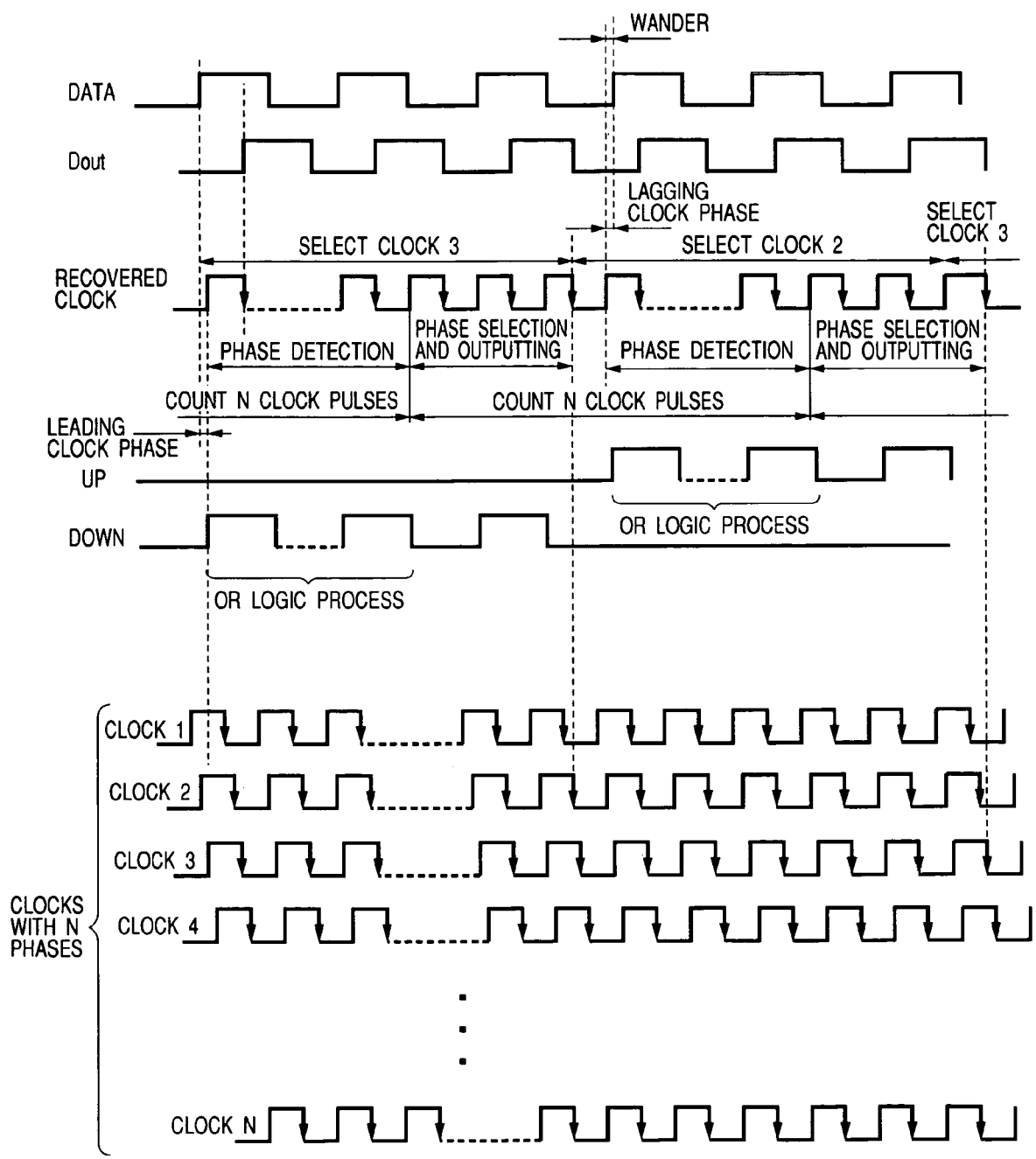
FIG. 3 shows timing charts of operations carried out by the first embodiment of the present invention.

FIG. 3 shows timing charts of operations carried out by the first embodiment of the present invention. The description begins with a state in which clock signal 3 has been selected as an initial recovered clock signal. Phases are detected from a state in which the rising edge of the recovered clock signal leads ahead of the rising edge of the data. DOWN signals output over a period including a plurality of cycles are subjected to an OR, logic process in the counter 105, and the counter 105 outputs one signal for every 16 cycles. The output signal is used as a feedback signal to phase-selection and clock-outputting processes for switching the clock signal to clock signal 2. Then, due to a wander, the data edge deviates, causing the raising edge of the recovered clock signal to lag behind the data edge. From this state, phases are detected, causing the phase comparator 103 to output UP signals. By the same token, the UP signals output over a period including a plurality of cycles are subjected to the OR logic process in the counter 105, and the counter 105 outputs one signal for every 16 cycles. The output signal is used as a feedback signal to the phase-selection and clock-outputting processes for switching the clock signal back to clock signal 3. After the results of the phase comparison are reflected in the recovered clock signal as described above, successive processing is carried out.

Figure 4:
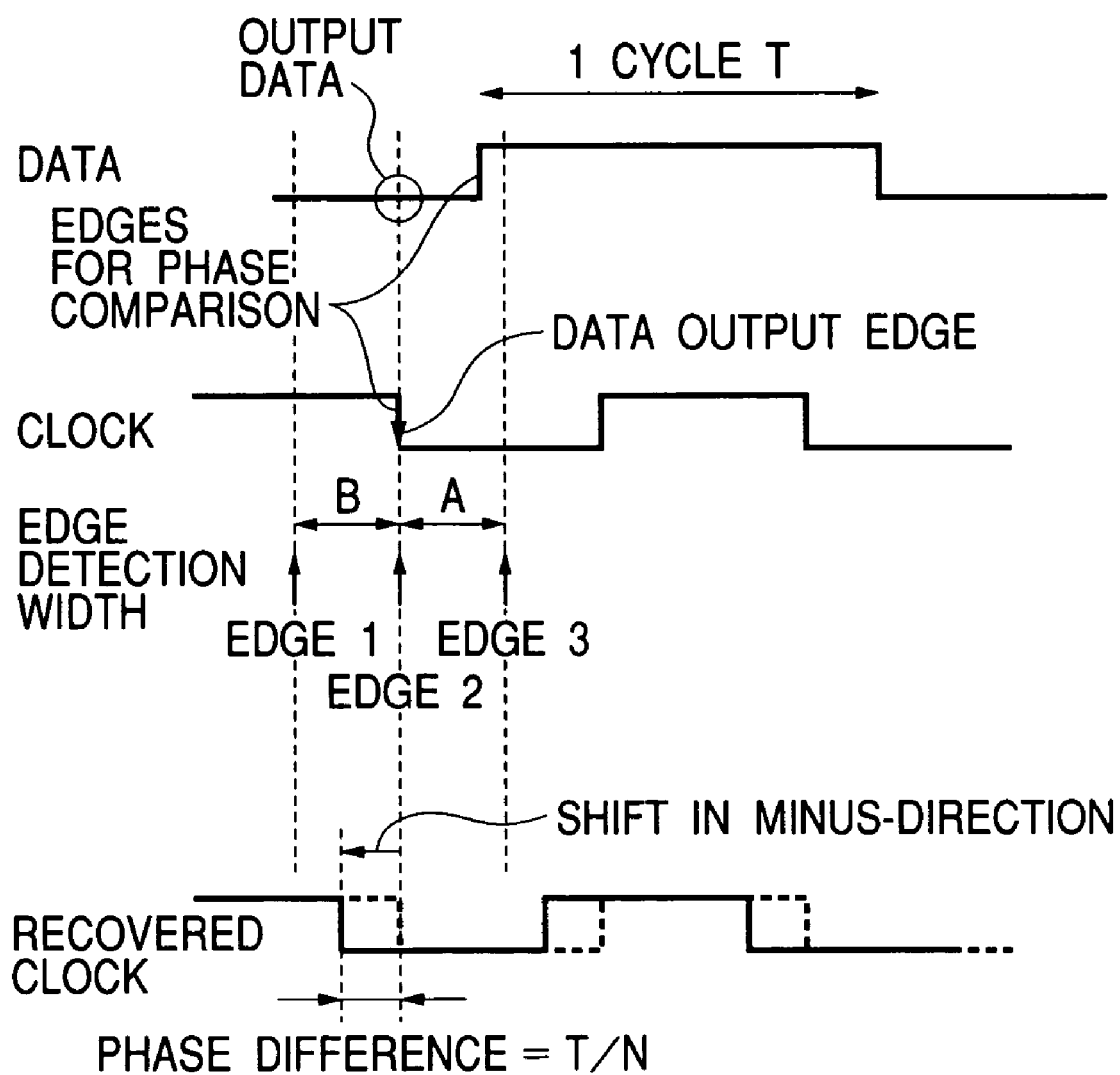
FIG. 4 is a diagram showing basic operations carried out by the first embodiment of the present invention.

FIG. 4 is a diagram showing basic operations carried out by the CDR circuit implemented by the first embodiment of the present invention. If a rising edge of data exists in edge detection width A between falling edge 2 of recovered clock signal 2 and falling edge 3 of recovered clock signal 3, the clock signal is shifted in the minus direction by a phase differential of T/N. If a rising edge of data exists in edge detection width B between falling edge 2 of recovered clock signal 2 and falling edge 1 of recovered clock signal 1, the clock signal is shifted in the plus direction by the phase differential of T/N. Data is taken in and output on a falling edge of a clock signal.

Edge detection widths A and B explained above by referring to FIG. 4 are determined on the basis of the clock phases defining edges 1, 2 and 3. The edge detection widths determined in this way are referred to as reference values. To put it concretely, edge detection widths A and B are defined as relative phases, i. e., a phase of 0 degree, a phase of +90 degrees and a phase of −90 degrees, as follows:

Edge detection width A=Phase of 0 degree to phase of −90 degrees=¼ cycles.

Edge detection width B=Phase of 90 degrees to phase of 0 degree =¼ cycles.

The values defined above are reference values having an effect on the jitter/wander tolerance characteristic. Even though other parameters also have effects on the jitter/wander tolerance characteristic, in this embodiment, the reference values are each defined as ¼ cycles.

Figure 5:
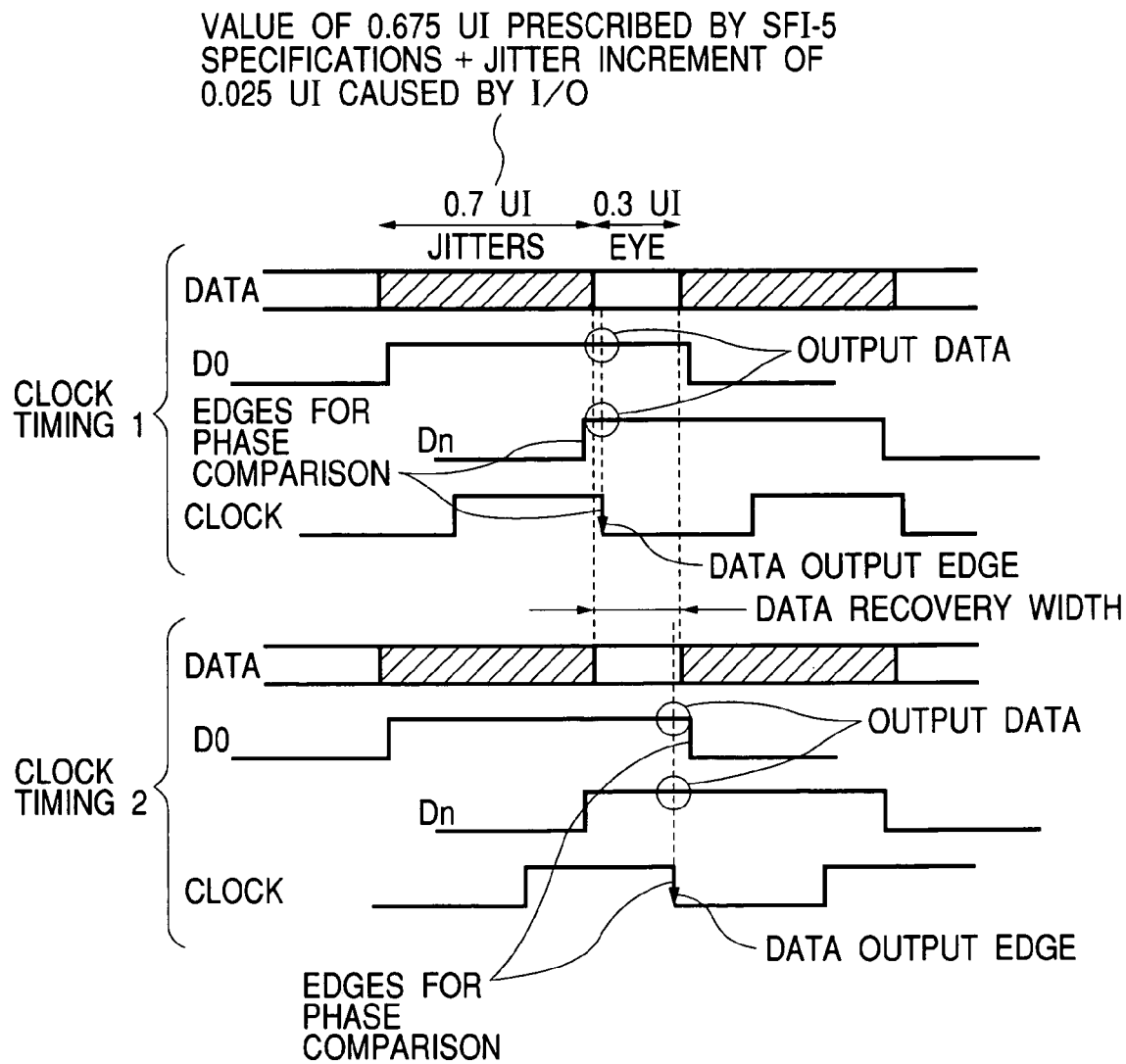
FIG. 5 is a diagram showing an edge detection method adopted by the first embodiment of the present invention.

FIG. 5 is a diagram showing an edge detection method (or an eye-tracking method) adopted by the first embodiment of the present invention. As the jitters, a value of 0.7 UI is taken into consideration. The value of 0.7 UI is a result of adding a jitter increase of 0.025 UI caused by the I/O to a standard value of 0.675 UI. This standard value is an SFI-5 standard value. First of all, as explained in the description of the basic operations, when a data edge enters an edge detection width, the clock phase is switched from the present one to another to keep the clock edge away from the data edge. If no data edge exists in an edge detection width, on the other hand, the clock phase is not switched from the present one to another. Thus, the clock edge always exists in the eye. That is to say, data can be output correctly without having a specific clock falling edge shifted to a position outside a data recovery width. The specific clock falling edge is a clock falling edge subjected to phase comparison with data edges on both sides of jitters at the eye.

As described above, a clock data output edge, which is the clock edge subjected to phase comparison with data edges on both sides of the eye, is in the eye, and data can be output correctly. In addition, ideally, switching of the clock phase moves the position of the data recovery edge of the clock signal toward the center of the eye.

Figure 6:
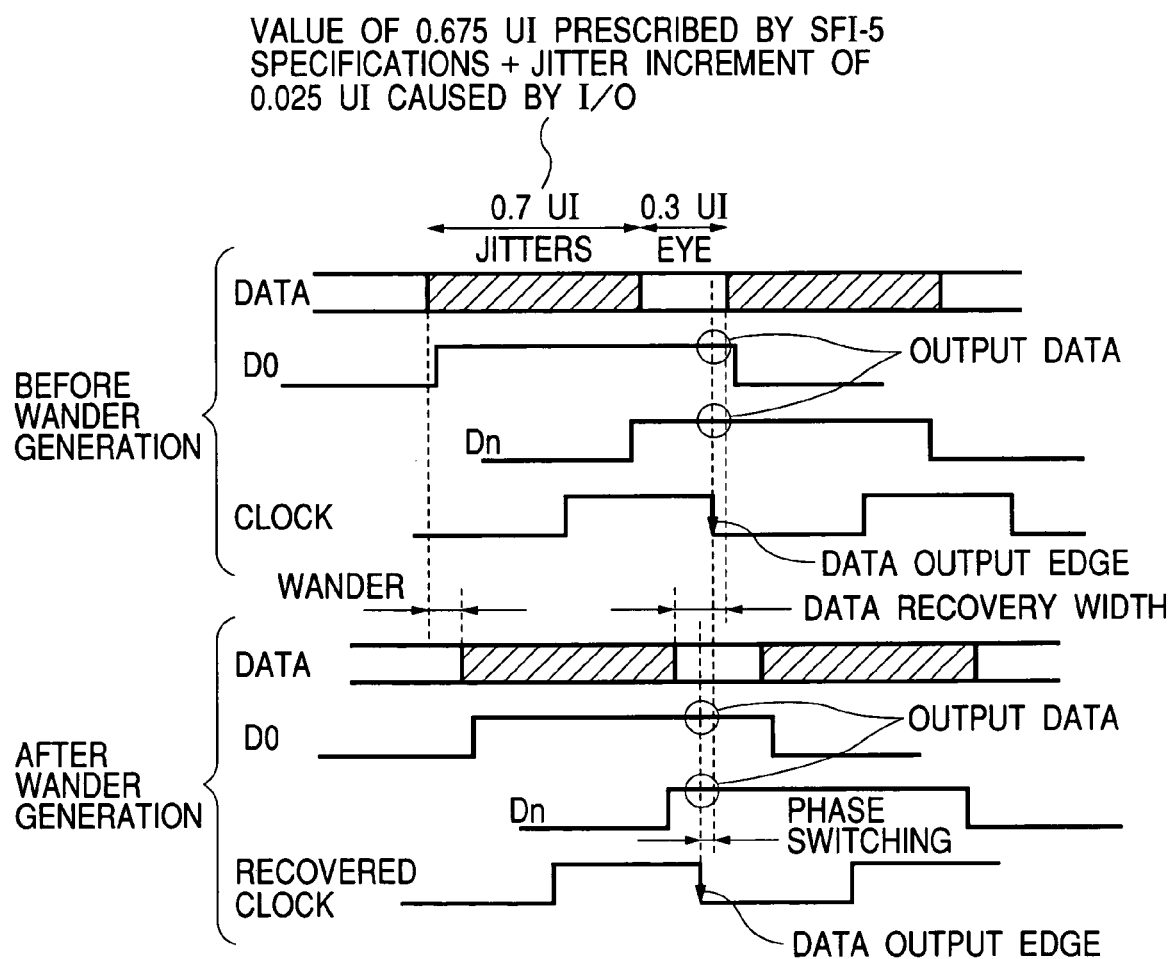
FIG. 6 is a diagram showing relations between an eye and clock jitters with a wander generated in the first embodiment of the present invention.
Figure 8:
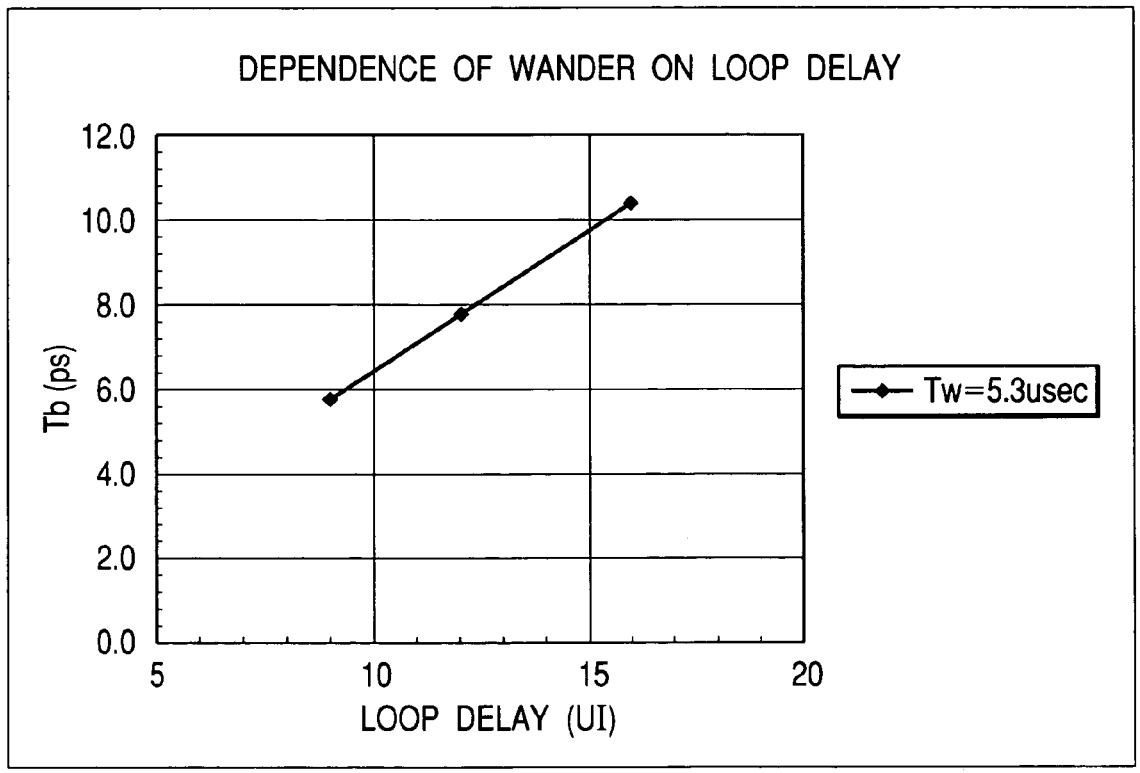
FIG. 8 is a diagram showing graphs representing dependence of a wander on a loop delay in the first embodiment of the present invention.

FIG. 6 is a diagram showing relations between the eye and clock jitters with a wander generated in the CDR circuit implemented by the first embodiment of the present invention. Prior to generation of a wander, the falling edge of the clock signal exists at a position separated from a jitter range in the eye by the magnitude of edge detection width A or B, which is equal to ¼ cycles, and pieces of data D0 to Dn can be output correctly. With a wander changing during a loop delay, on the other hand, the data edge deviates at Tb=~5.8 ps as shown in FIG. 8. The loop delay Ta is a period of time between an output operation carried out by the counter 5 and the first phase comparison. As described above, however, the falling edge of the clock signal exists at a position separated away from the eye by about ¼ periods (or 80 ps for a period T of 320 ps). Thus, even if Tb deviates in the left or right direction, the falling edge of the clock signal is never shifted to a position outside the data recovery width.

As described above, even after a wander change, the clock signal obtained as a result of the phase comparison feedback exists in the data recovery width. Thus, data can be output correctly. It is to be noted that, if a wander reduces the data recovery width, it is desirable to decrease the ratio of the wander to the loop delay.

Figure 7:
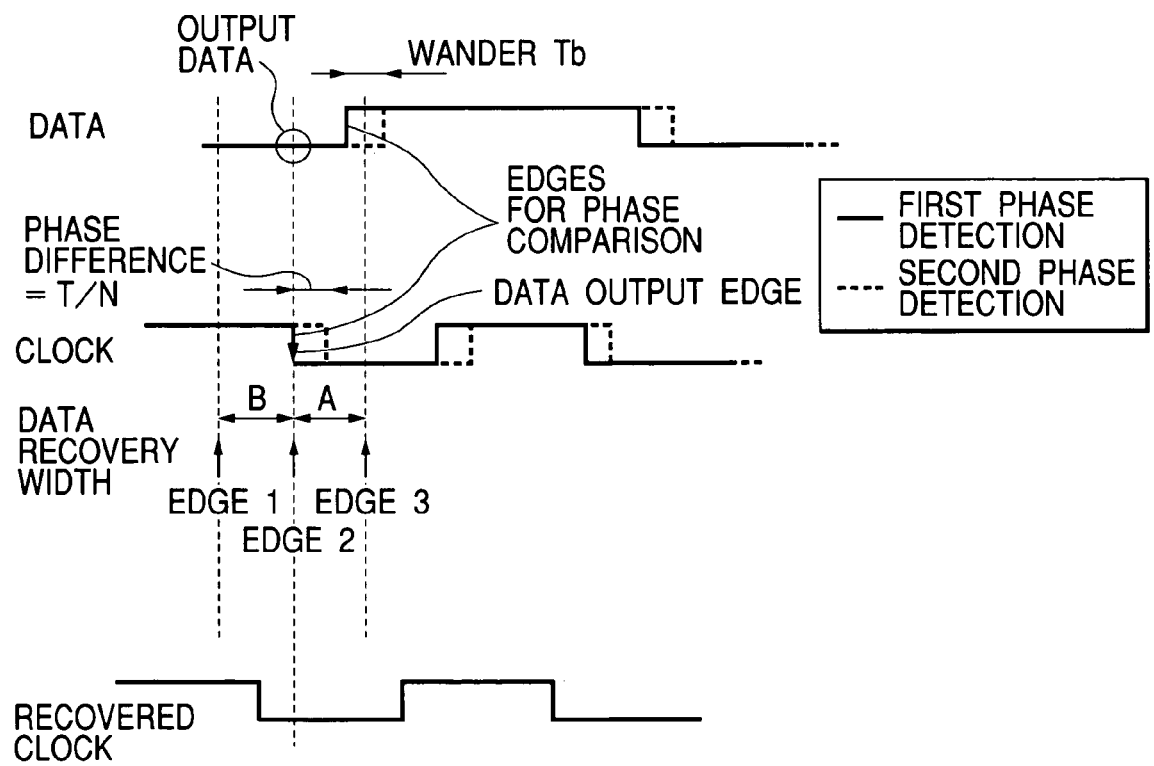
FIG. 7 is a diagram showing a relation between a data edge and an edge detection width with a wander generated in the first embodiment of the present invention.

FIG. 7 is a diagram showing a relation between the data edge and the edge detection width with a wander generated in the CDR circuit implemented by the first embodiment of the present invention. The data edge at the first phase detection exists in the edge detection width and the phase of the recovered clock signal is reflected in the second switched phase detection. In the mean time, a wander causes the data edge to deviate at Tb=~10 ps as shown in FIG. 8. Even if a wander is generated in a direction leaving edge detection width A or B for the clock edge at the second phase detection, no data edge exists in the edge detection width so that an operation to recover data at the eye is continued without switching the clock edge. If a wander is generated in a direction toward an edge detection width, on the other hand, a data edge enters edge detection width A so that the clock switch is switched to keep away the clock edge from the data edge. If wanders are generated consecutively in the same direction, however, in accordance with a relation between the wander and the switched phase change quantity, it is quite within the bounds of possibility that the data edge surpasses the clock edge. That is to say, in order to track the wander Tb, a condition expressed by relation (1) given below must be satisfied:

$$Tb = B \times \sin(2p \times Ta/Tw) < T/N \quad (1)$$

where symbol N denotes the number of phase divisions, symbol T denotes a clock period, symbol Ta denotes a loop delay, symbol B denotes a maximum phase change of input data and symbol Tw denotes a phase deviation period. Thus, the ratio T/N denotes a difference between 2 adjacent phases. As described earlier, the loop delay Ta is a period of time between an output operation carried out by the counter and the first phase comparison. The maximum phase change B is a maximum among phase changes occurring over a long period of time.

In the case of the CDR circuit implemented by the first embodiment of the present invention, the following typical values are used: N=16, T=320 ps, Ta=9 UI, B=10.65 UI and Tw=5.3 ps. Substituting these typical values into relation (1) yields the following:

$$Tb = B \times \sin(2p \times Ta/Tw) = 5.8 \text{ ps and } T/N = 20 \text{ ps.}$$

Thus, the condition expressed by relation (1) is satisfied. Accordingly, the CDR circuit implemented by the first embodiment of the present invention is able to keep tracking wanders.

That is to say, in this embodiment, if a condition described below is satisfied, the data edge exists in the edge detection width and the clock edge follows the data edge.

The following relation expresses a condition for the clock edge to track the wander Tb of the data:

$$Tb = (10.65 \text{ UI}/2) \times T \times \sin(2p \times Ta/Tw) < T/N$$

Figure 9:
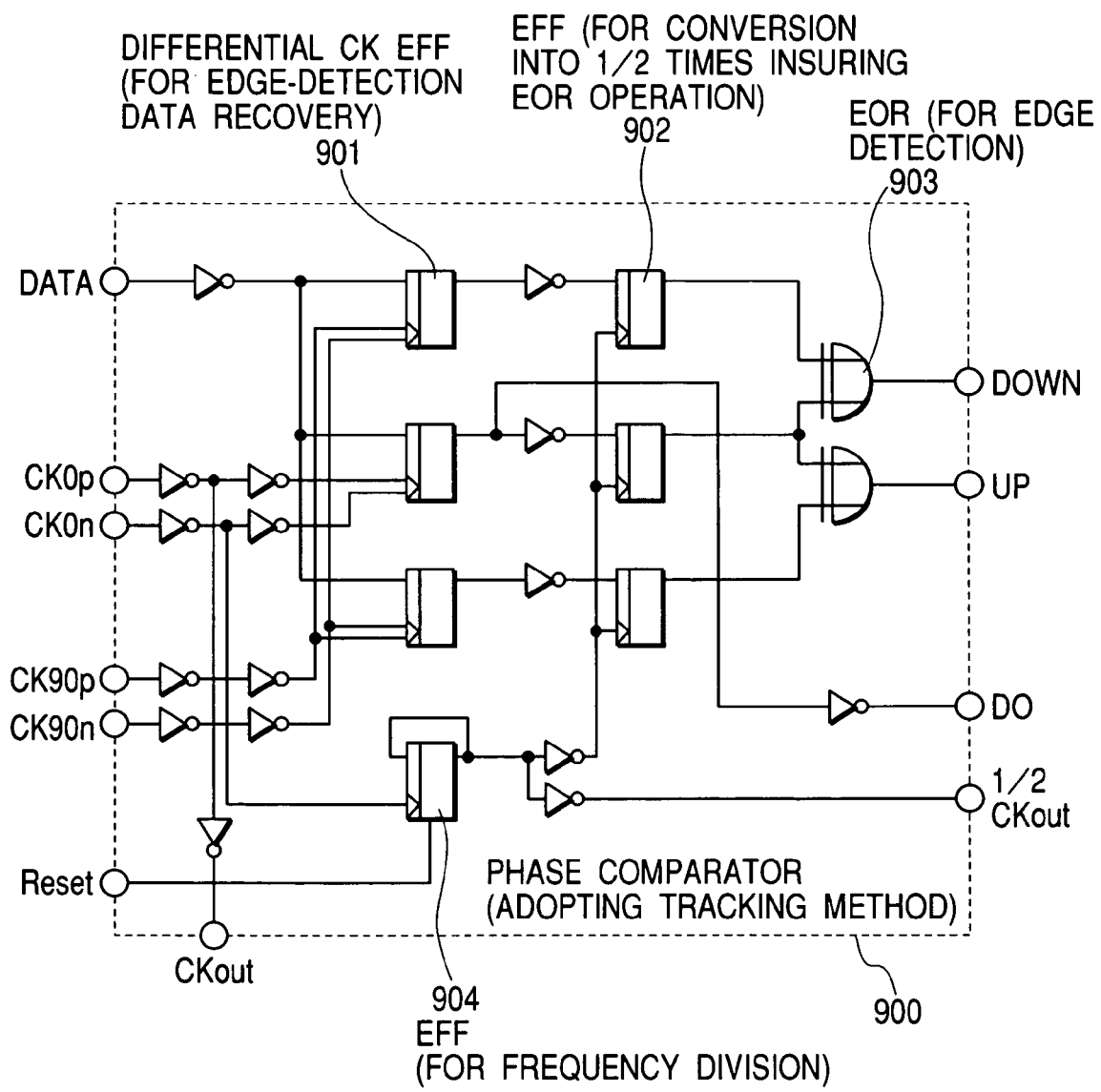
FIG. 9 is a circuit diagram showing a phase comparator provided by the first embodiment of the present invention.

FIG. 9 is a circuit diagram showing a phase comparator 900 provided by the first embodiment of the present invention. The phase comparator 900 typically comprises data-recovery-use differential clock FFs 901, EOR-operation-insurance-use ½-time conversion FFs 902, phase-comparison-use EORs 903 and a frequency-division-use FF 904.

The data-recovery-use differential clock FFs 901 input the same data and 3 clock signals with phases of −90 degrees, 0 degree and +90 degrees respectively. By taking EOR operations into consideration, the EOR-operation-insurance-use ½-time conversion FFs 902 divide the frequencies of signals output by the data-recovery-use differential clock FFs 901. The phase-comparison-use EORs 903 compare the phases of signals output by the EOR-operation-insurance-use ½-time conversion FFs 902. Phases are compared and results of the phase comparisons are represented by the data output by the data-recovery-use differential clock FFs 901, which take in the input data at the phases of −90 degrees, 0 degree and +90 degrees of the three respective clock signals. If a data edge exists between the phases, an "H" signal is supplied to the first input of a specific one of the phase-comparison-use EORs 903 and an "L" signal is supplied to the second input of the specific phase-comparison-use EOR 903. As a result, the specific phase-comparison-use EOR 903 outputs an "H" UP or DOWN signal as an edge detection signal.

Figure 10:
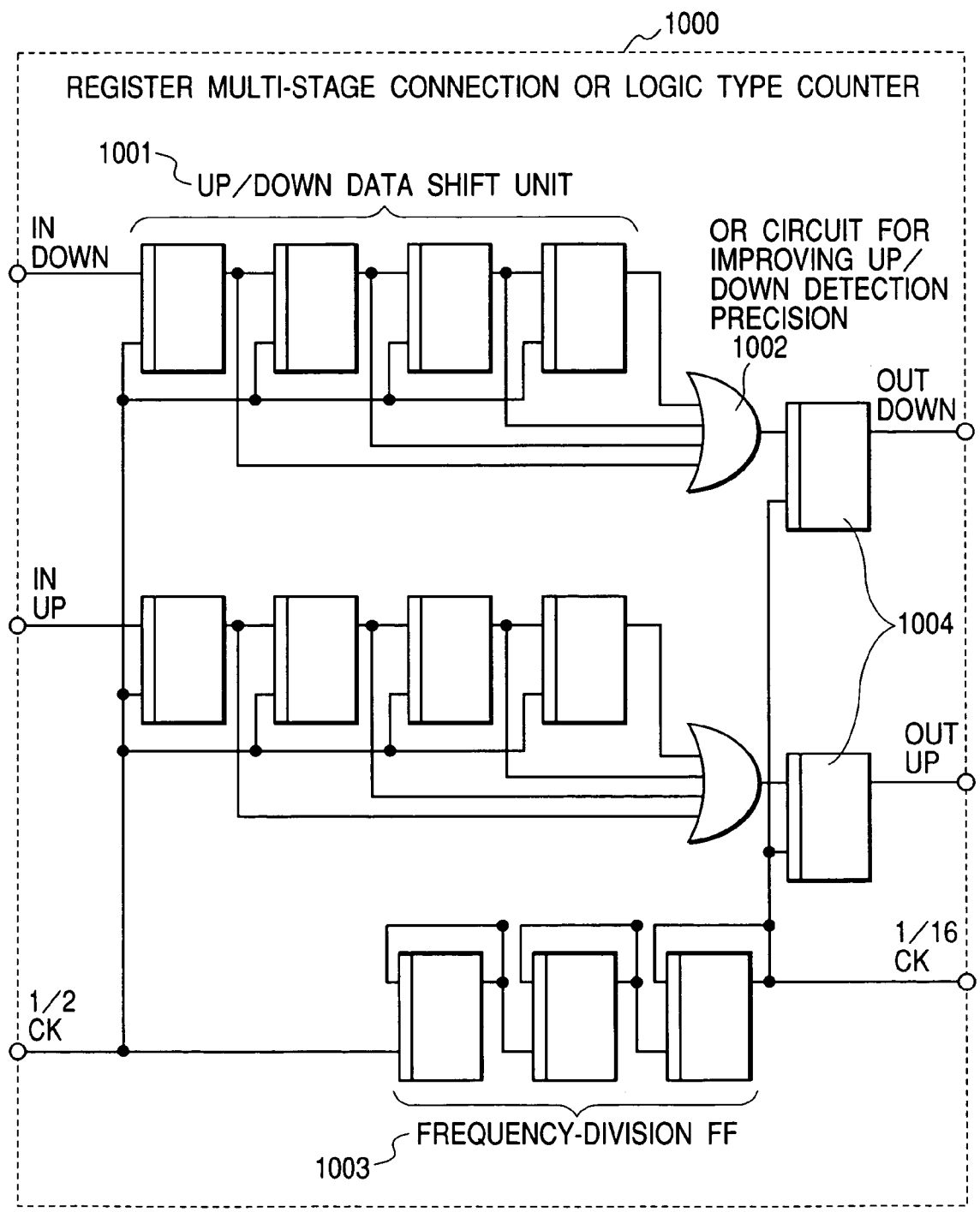
FIG. 10 is a block diagram showing a counter provided by the first embodiment of the present invention.

FIG. 10 is a block diagram showing a register multi-stage connection OR logic type counter 1000 provided by the first embodiment of the present invention. As shown in FIG. 10, the register multi-stage connection OR logic type counter 1000 typically comprises UP/DOWN data shift units 1001 each used for storing phase-comparison results obtained over a plurality of cycles, OR circuits 1002 each used for improving UP/DOWN detection precision, frequency-division FFs 1003 used for adjustment of an output frequency and output FFs 1004. Data of input UP and DOWN signals is supplied to the output FFs 1004 by way of the UP/DOWN data shift units 1001 and the OR circuits 1002, and output from the output FFs 1004 with timings determined by 16 clock signals generated by the frequency-division FFs 1003 as results of frequency divisions. The register multi-stage connection OR logic type counter 1000 has a mechanism wherein, during a phase detection period, phases are compared over a plurality of cycles and UP/DOWN data is stored in the UP/DOWN data shift units 1001. The stored data is then subjected to an OR logic process in order to increase the frequency of the phase detection so that the detection precision can be improved.

Figure 11:
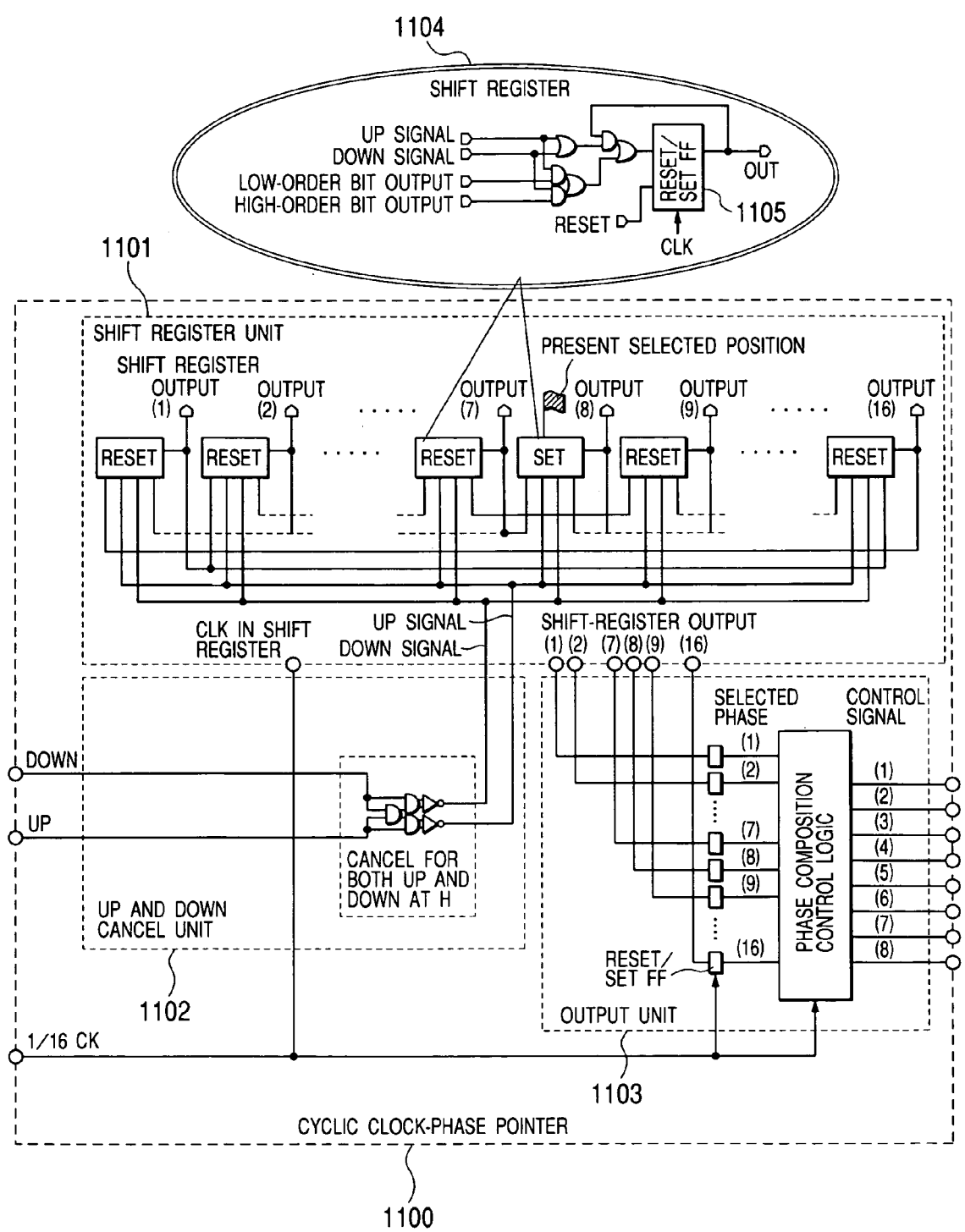
FIG. 11 is a block diagram showing a cyclic clock-phase pointer provided by the first embodiment of the present invention.

FIG. 11 is a block diagram showing a cyclic clock-phase pointer 1100 provided by the first embodiment of the present invention. As shown in FIG. 11, the cyclic clock-phase pointer 1100 typically comprises a shift register unit 1101, an UP/DOWN cancel unit 1102 and an output unit 1103. The shift register unit 1101 comprises shift registers 1104 connected to each other to form a ring. The shift registers 1104 each include a FF 1105 for storing information of "1" indicating a selected clock phase. A clock phase is switched by propagating this information as the UP signal in the right direction or the DOWN signal in the left direction at a speed corresponding to ¹⁄₁₆ of the clock period. The UP/DOWN cancel unit 1102 is a NAND logic circuit, which cancels both the UP and DOWN signals to keep the phase clock unchanged when both the UP and DOWN signals are supplied to the UP/DOWN cancel unit 1102 at the same time. The output units 1103 decode 16 pieces of information output by the shift register unit 1101 into 8 pieces of output information.

As described above, the first embodiment compares the position of the edge of data with the position of the edge of a data recovery clock signal (or a recovered clock signal). When a gap between the edges becomes smaller than a reference value, the clock edge is kept away from the data edge. A cycle of a reference clock signal is divided into N portions to generate N clock signals with phases different from each other. One of the N generated clock signals, which has a phase selected among the phases, is taken as the data recovery clock signal.

In addition, the position of the edge of data is compared with the position of the edge of a data recovery clock signal to execute control for placing the edge of the data recovery clock signal in an eye narrowed by high-frequency phase deviations (jitters) of the data. Then, data is taken in with a timing determined by the edge of the clock signal serving as an object of the phase comparison.

Another clock data recovery circuit comprises: a phase comparator for comparing the phase of input data with the phase of a data recovery clock signal generated internally and outputting shift directions of the phase of the data recovery clock signal as UP and DOWN signals; a counter for controlling a frequency at which the UP and DOWN signals are fed back to a means for determining the phase of the data recovery clock signal; a cyclic clock-phase pointer for controlling an output phase of the data recovery clock signal on the basis of OUT UP and OUT DOWN signals output by the counter; and a phase variable-delay circuit for outputting a clock phase according to a phase control signal.

In the clock data recovery circuit, the data recovery clock signal is recovered from the input data and the input data is taken in with a timing determined by the recovered clock signal.

A further clock data recovery circuit comprises: a counter for controlling a frequency at which UP and DOWN signals are fed back to a means for determining the phase of the data recovery clock signal; a cyclic clock-phase pointer for controlling an output phase of the data recovery clock signal on the basis of OUT UP and OUT DOWN signals output by the counter; and a phase variable-delay circuit for outputting a clock phase according to a phase control signal.

In the clock data recovery circuit, a cycle of a reference clock signal is divided into N portions to generate N clock signals with phases different from each other. Then, the phase variable-delay circuit selects one of the N generated clock signals as the data recovery clock signal. The selected clock signal has a phase selected among the phases by the cyclic clock-phase pointer.

In other words, the clock data recovery circuit has a function to select one phase to be output by the phase variable-delay circuit. The phase is selected on the basis of a plurality of results of phase detection carried out over a plurality of cycles having a phase-switching pitch Tp smaller than a value determined by the cyclic clock-phase pointer.

In accordance with the first embodiment described above, a gap between the position of the edge of data and the position of the edge of a recovered clock signal smaller than a reference value means that the data edge enters edge detection width A or B, which has a magnitude of 80 ps. If the data edge enters an edge detection width, the clock phase is switched from the present one to another to keep the clock edge away from the data edge. If no data edge exists in an edge detection width, on the other hand, the clock phase is not switched from the present one to another. Thus, the clock edge always exists in the eye. As a result, even for data having jitters of 0.7 UI, it is possible to take in the data and, hence, improve the jitter tolerance characteristic.

In accordance with the first embodiment described above, it is thus possible to improve the jitter tolerance characteristic of the digital clock data recovery circuit implemented by the first embodiment.

In addition, the first embodiment described above includes: a function to compare the position of the edge of data with the position of the edge of a data recovery clock signal (or a recovered clock signal) and keep the clock edge away from the data edge if a gap between the edges becomes smaller than a reference value; and a function to divide a cycle of a reference clock signal into N portions to generate N clock signals with phases different from each other and take one of the N generated clock signals, which has a phase selected among the phases, as the data recovery clock signal.

It is also possible to move the edge of the data recovery clock signal to track a wander, which is a long period phase deviation of input data, by comparing the position of the edge of the input data with the position of the edge of the data recovery clock signal.

In addition, in order to track a wander, a condition expressed by a relation given below must be satisfied:

$$Tb = B \times \sin(2p \times Ta/Tw) < T/N$$

where symbol N denotes the number of phase divisions, symbol T denotes a clock period, symbol Ta denotes a loop delay, symbol B denotes a maximum phase change of input data and symbol Tw denotes a phase deviation period. Thus, the ratio T/N denotes a difference between 2 adjacent phases. In this case, the loop delay Ta is a period of time between an output operation carried out by a phase comparator and an operation to reflect a selected phase in a clock signal supplied to the phase comparator. The maximum phase change B is a maximum among phase changes occurring over a long period of time.

Then, one phase to be output by the phase variable-delay circuit is selected on the basis of a plurality of results of phase detection carried out over a plurality of cycles having a phase-switching pitch Tp smaller than a value determined by the cyclic clock-phase pointer.

In accordance with the first embodiment, when a data edge enters edge detection width A or B having a magnitude of 80 ps, the clock phase is switched from the present value to another to keep away a clock edge from the data edge. In this way, the edge of the data recovery clock signal is moved to a location separated away from a jitter end in the eye by a distance approximately equal to edge detection width A or B having a magnitude of 80 ps. For a wander changing to a loop delay, on the other hand, the data edge deviates at Tb=~10 ps approximately. As described earlier, the loop delay Ta is a period of time between an output operation carried out by the counter and the first phase comparison. That is to say, even if a wander causes the data edge to deviate, the edge of the data recovery clock signal exists at a location separated away from a jitter end by a distance of approximately 80 ps. Thus, data can be taken in correctly without having a clock edge shifted to a position outside the eye.

With the magnitude of a wander increasing to a value greater than a phase-switching quantity, if the wander is generated consecutively in the same direction toward the edge detection width, it is quite within the bounds of possibility that the data edge surpasses the clock edge. Thus, the phase-switching quantity T/N limits the wander magnitude Tb in accordance with relation (1). To put it concretely, in a configuration wherein the magnitude of the wander is suppressed by setting the time delay Ta at 9 UI, the change in phase is increased by setting the phase-division count N at 16. As described earlier, the loop delay Ta is a period of time between an output operation carried out by the counter and the first phase comparison. Thus, Tb is 5.8 ps and T/N is 20 ps, satisfying the condition expressed by relation (1). That is to say, it is possible to keep tracking the wander.

The first embodiment described above exhibits an effect of broadening the data recovery range of the digital clock data recovery circuit implemented by the first embodiment. The embodiment also exhibits an effect of improving the characteristic of the recovered clock signal to track a wander.

Figure 12:
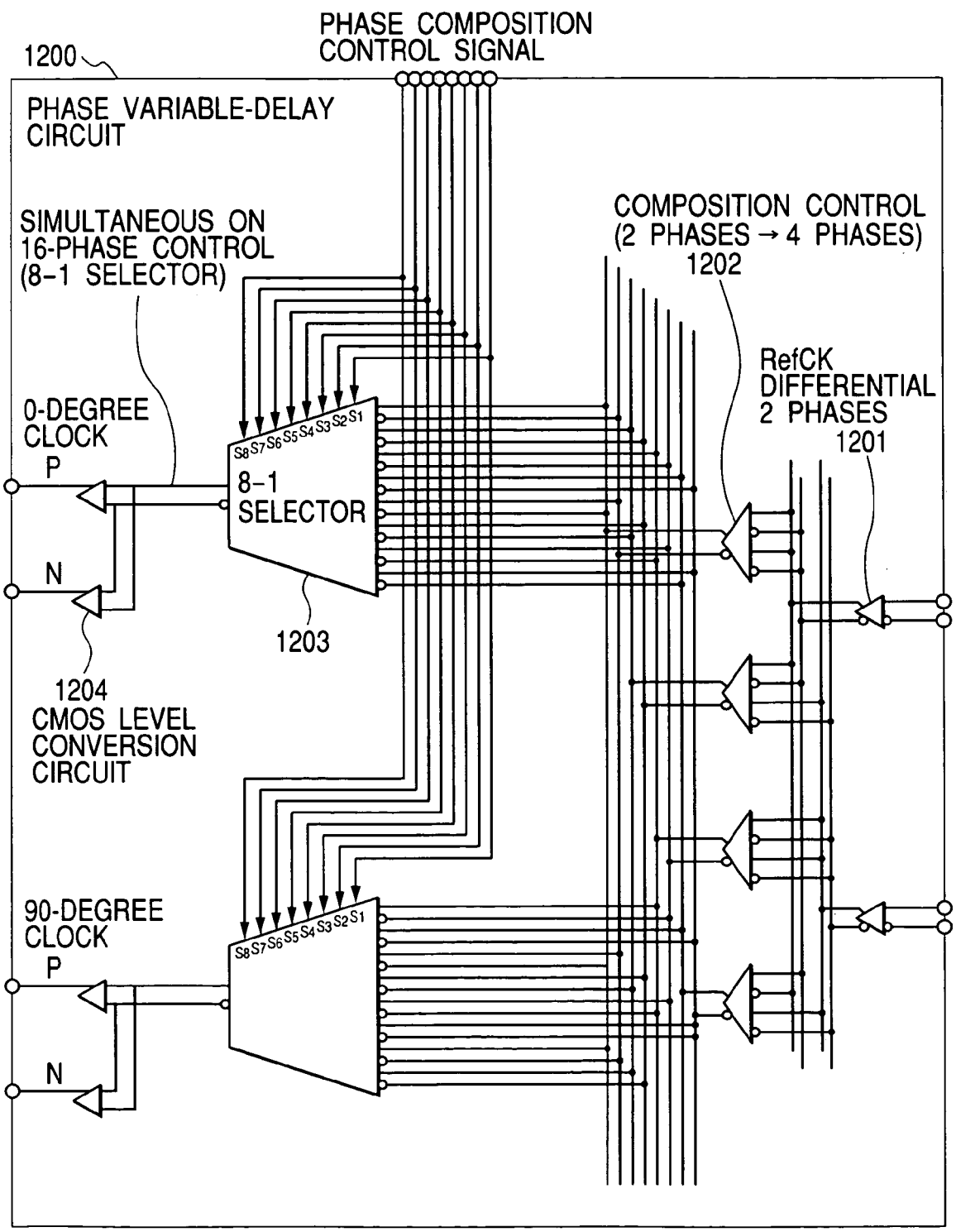
FIG. 12 is circuit diagram showing a phase variable-delay circuit implemented by a second embodiment of the present invention.
Figure 13:
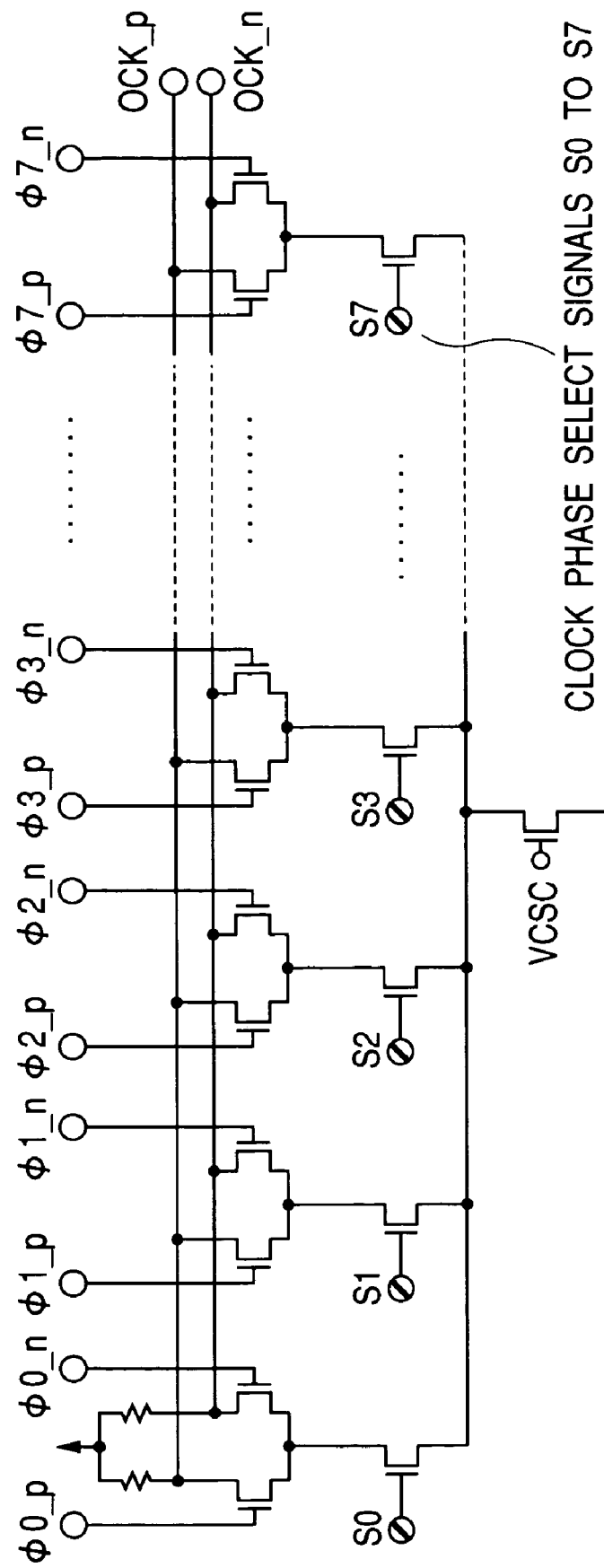
FIG. 13 is circuit diagram showing an 8-1 selector provided by the second embodiment of the present invention.

FIG. 12 is a circuit diagram showing a phase variable-delay circuit 1200 implemented by a second embodiment of the present invention. As shown in FIG. 12, the phase variable-delay circuit 1200 typically comprises buffers 1201, composition circuits 1202, 8-1 selectors 1203 shown in FIG. 13 and CMOS level conversion circuits 1204. The buffers 1201 are each a memory for storing 0-degree/90-degree clock inputs. The composition circuits 1202 form a unit for generating 8 signals having phases different from each other from 2 signals having phases different from each other. The 8-1 selectors 1203 form a unit for treating the 8 signals with phases different from each other as 16 signals having 16 different selectable phases and selecting a phase from the 16 phases. In order to output a 0-degree differential clock signal and a 90-degree differential clock signal, the 8-1 selectors 1203 and the CMOS level conversion circuits 1204 are each designed as a dual component. The 0-degree differential clock signal and the 90-degree differential clock signal are signals for creating edge detection widths.

The composition circuits 1202 include a circuit for outputting an input phase as it is and a circuit for outputting a middle phase between 2 input phases. As a result, the composition circuits 1202 generates 4 phases, i. e., 0 degrees, 45 degrees, 90 degrees and 135 degrees, from 2 input phases and inverts the 4 generated phases to eventually produce a total of 8 clock signals with phases different from each other. The 8-1 selectors 1203 receive 8 selector control signals. By executing control to turn on 2 of the 8 selector control signals supplied to each 2 adjacent pins of the 8-1 selectors 1203 at the same time, the 8-1 selectors 1203 are capable of generating middle phases between first and second phases and, hence, generating 1 of 16 phases from 8 input phases. The CMOS level conversion circuits 1204 each comprise a differential buffer, a sense amplifier and a CMOS INV for increasing amplitude to a CMOS level. In addition, the buffers 1201, the composition circuits 1202, the 8-1 selectors 1203 and the differential buffers included in the CMOS level conversion circuits 1204 are each designed as a small-amplitude differential circuit.

As described above, the phase variable-delay circuit of the second embodiment comprises buffers, composition circuits, N-1 selectors and CMOS level conversion circuits. The buffers, the composition circuits and the N-1 selectors are each designed as a small-amplitude differential circuit.

The N-1 selectors receive N selector control signals. By executing control to turn on 2 of the N selector control signals supplied to each 2adjacent pins of the N-1 selectors at the same time, the N-1 selectors are capable of generating a middle phase between first and second phases and, hence, generating one of N×2 phases from N input phases.

In accordance with the second embodiment described above, the composition circuits and the N-1 selectors are not circuits for generating N phases by controlling a current source. Instead, the composition circuits and the N-1 selectors are circuits operating on the basis of a constant current source. Thus, it is not necessary to allow a current to flow, the current having a magnitude 16 times the magnitude of an operation limit current in phase control. Instead, it is necessary to allow a current to merely flow, the current having a magnitude 2 to 3 times the magnitude of an operation limit current to the utmost or a current of about 0.45 mA to give a stable operation. Thus, the power consumption can be reduced to ⅕.

In addition, by executing control to turn on 2 of the 16 selector control signals supplied to each 2 adjacent pins of the 8-1 selectors at the same time, it is possible to reduce the power consumption to ½ times the power consumption of a circuit comprising two 8-1 selectors and a composition circuit to generate 16 clock signals with phases different from each other.

Thus, the second embodiment exhibits an effect of reducing the power consumption of the digital clock data recovery circuit.

Figure 14:
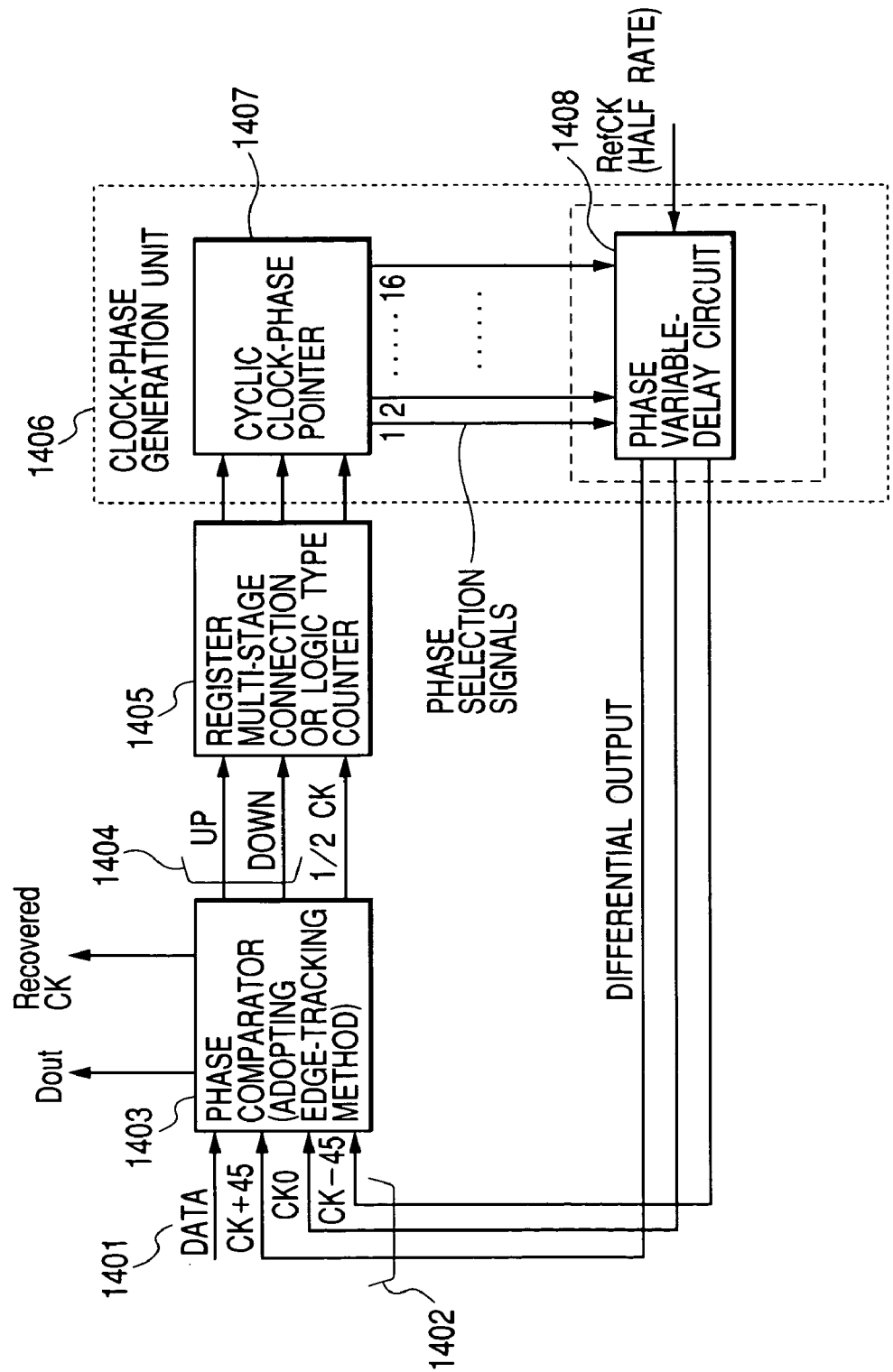
FIG. 14 is a block diagram showing the configuration of a digital-control type clock data recovery circuit implemented by a third embodiment of the present invention.

FIG. 14 is a block diagram showing the configuration of a digital clock data recovery circuit implemented by a third embodiment of the present invention.

As shown in FIG. 14, the digital clock data recovery circuit comprises: a phase comparator 1403 for comparing the phase of input data 1401 with the phase of a data recovery clock signal 1402 generated internally and outputting a shift direction of the phase of the data recovery clock signal 1402 as UP and DOWN signals 1404; a register multi-stage connection OR logic type counter 1405 for controlling a frequency at which the UP and DOWN signals 1404 are fed back to a means for determining the phase of the data recovery clock signal 1402; and a clock-phase generation unit 1406 for generating an output phase of the data recovery clock signal on the basis of signals output by the counter 1405.

The clock-phase generation unit 1406 comprises a cyclic clock-phase pointer 1407 and a digital-control type phase variable-delay circuit 1408.

Since the digital clock data recovery circuit as a whole operates at a half rate, the number of switched phases in the phase variable-delay circuit 1408 is increased to 32 in order to provide 16 phases at a full rate. A selector selects one of the 32 switched phases in accordance with digital control. Basic operations are the same as those of the digital-control type clock data recovery circuit implemented by the first embodiment of the present invention.

The third embodiment exhibits the same effects as those of the first embodiment. Since the digital clock data recovery circuit operates at a half rate, the digital clock data recovery circuit is capable of operating over a frequency band with 2 times the width of the frequency band of the first embodiment.

In addition to the effects exhibited by the first embodiment, the third embodiment also exhibits an effect of an operation speed increased by operating the digital clock data recovery circuit at a half rate.

Figure 15:
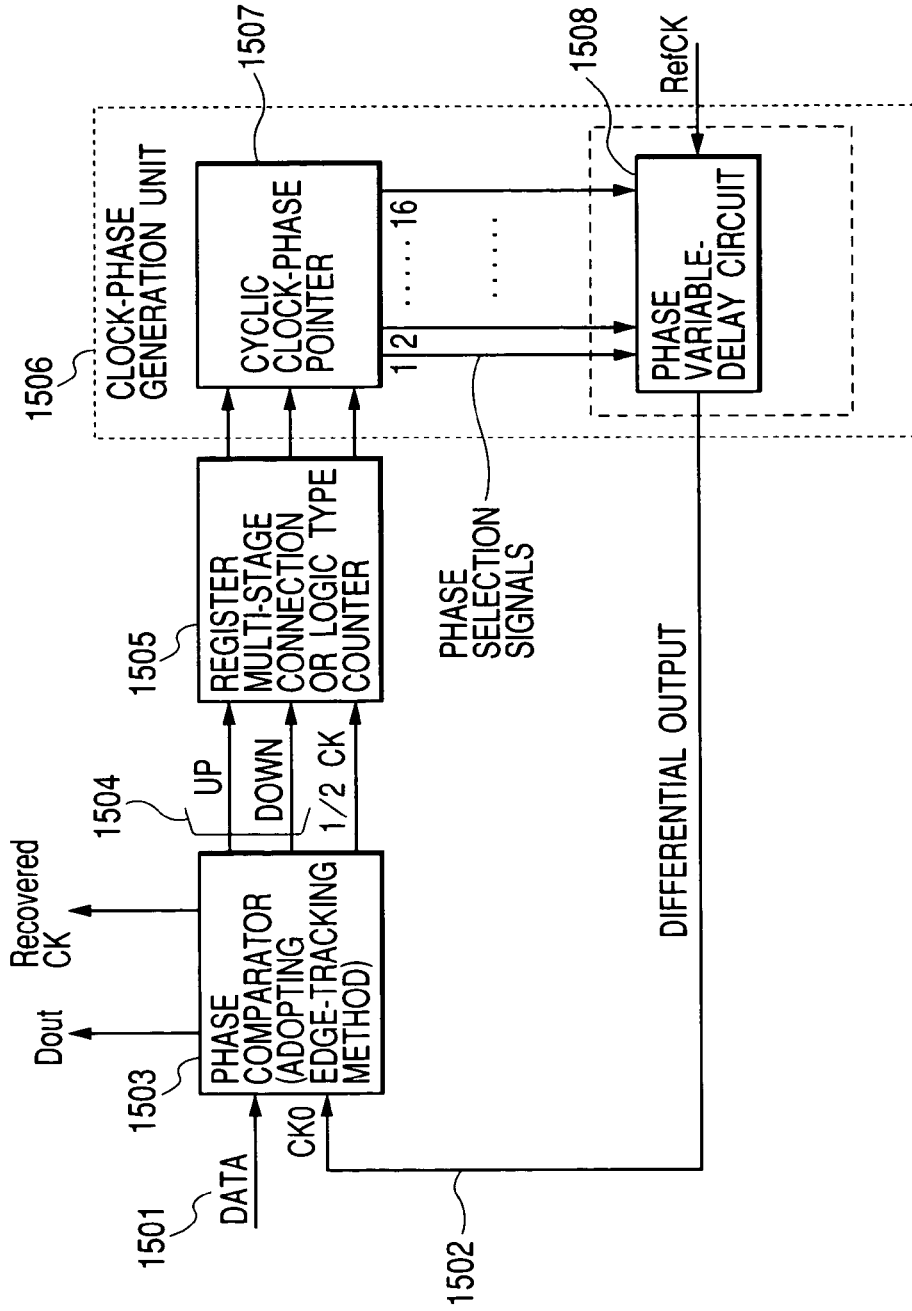
FIG. 15 is a block diagram showing the configuration of a digital-control type clock data recovery circuit implemented by a fourth embodiment of the present invention.
Figure 16:
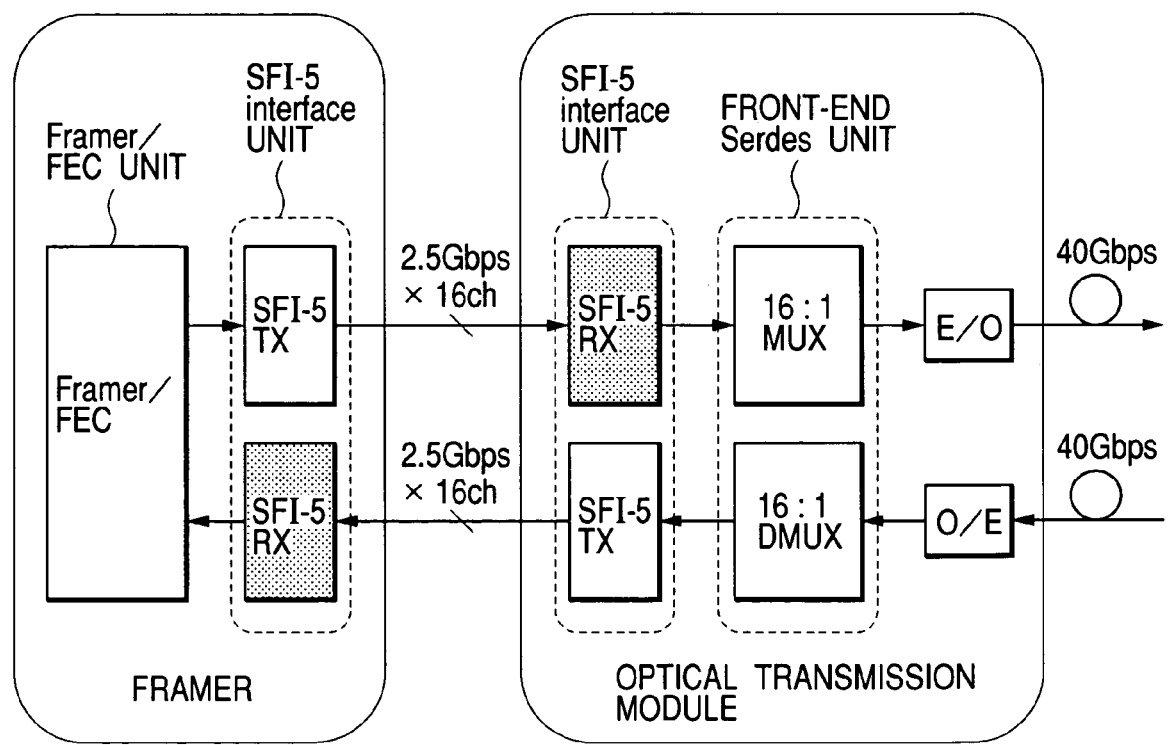
FIG. 16 is a block diagram showing an optical transmission module.
Figure 17:
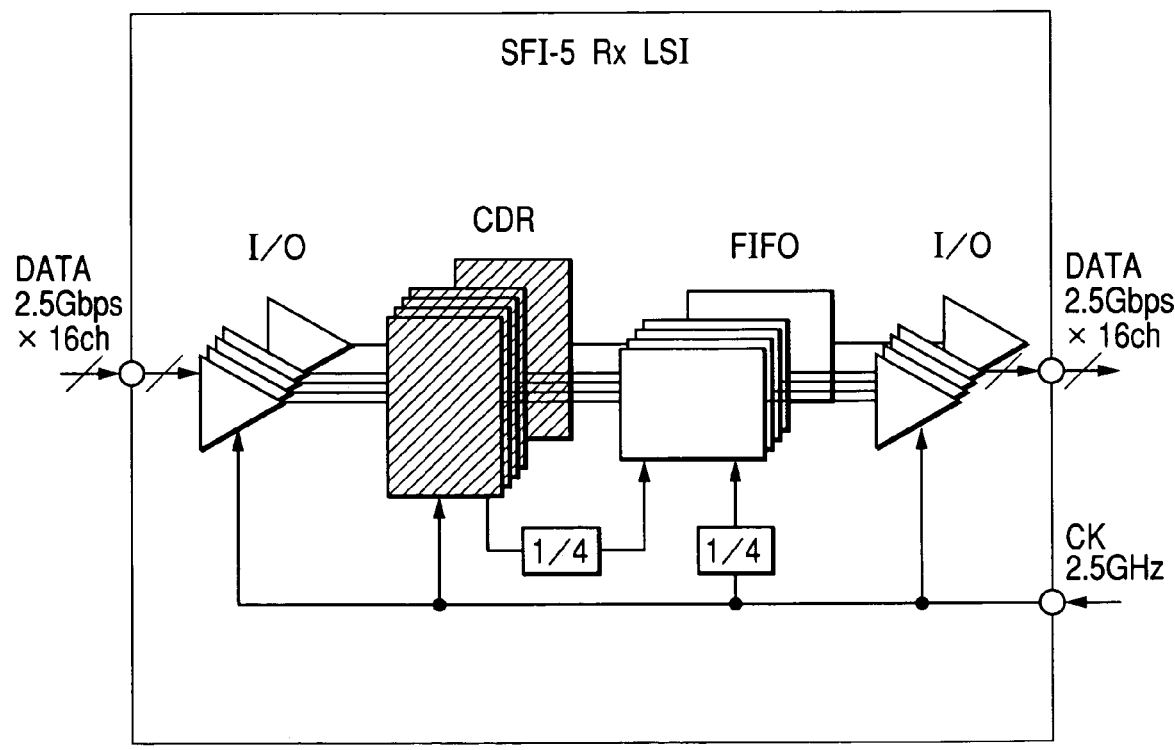
FIG. 17 is a block diagram showing an SFI-5 Rx LSI.
Figure 18:
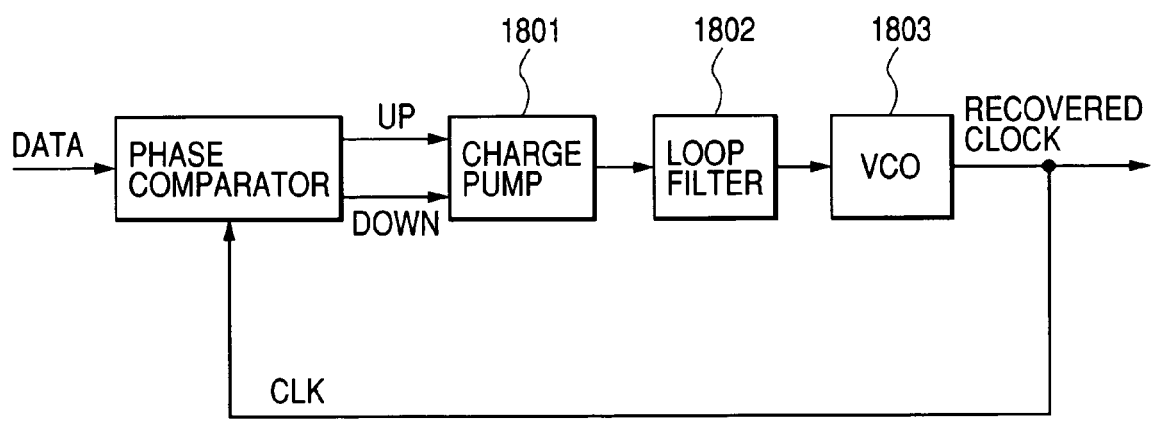
FIG. 18 is a block diagram showing the configuration of a CDR (Clock and Data Recovery) circuit employing a commonly known VCO (Voltage-Controlled Oscillator) for a comparison purpose.
Figure 19:
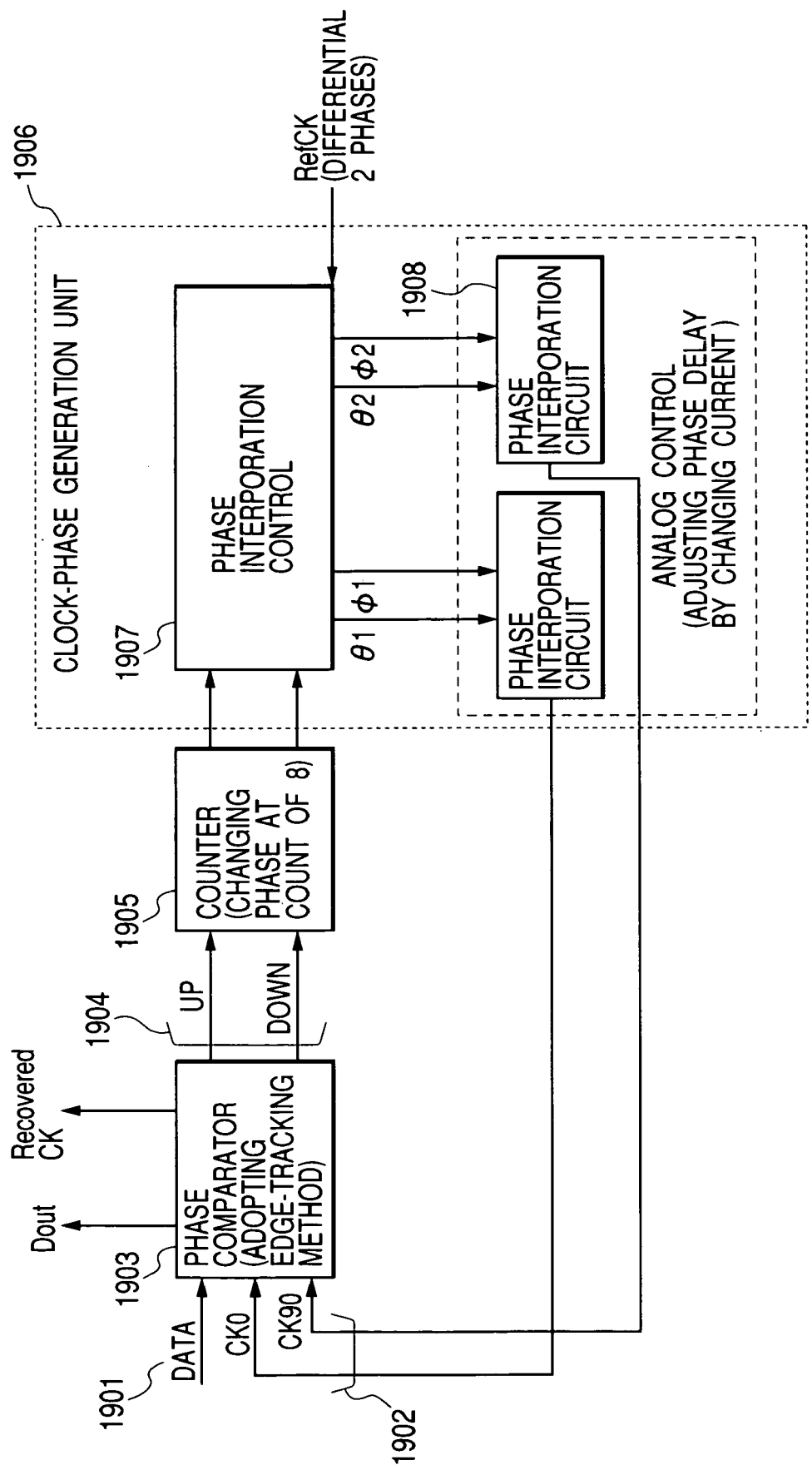
FIG. 19 is a block diagram showing the configuration of a variable delay type CDR circuit for a comparison purpose.
Figure 20:
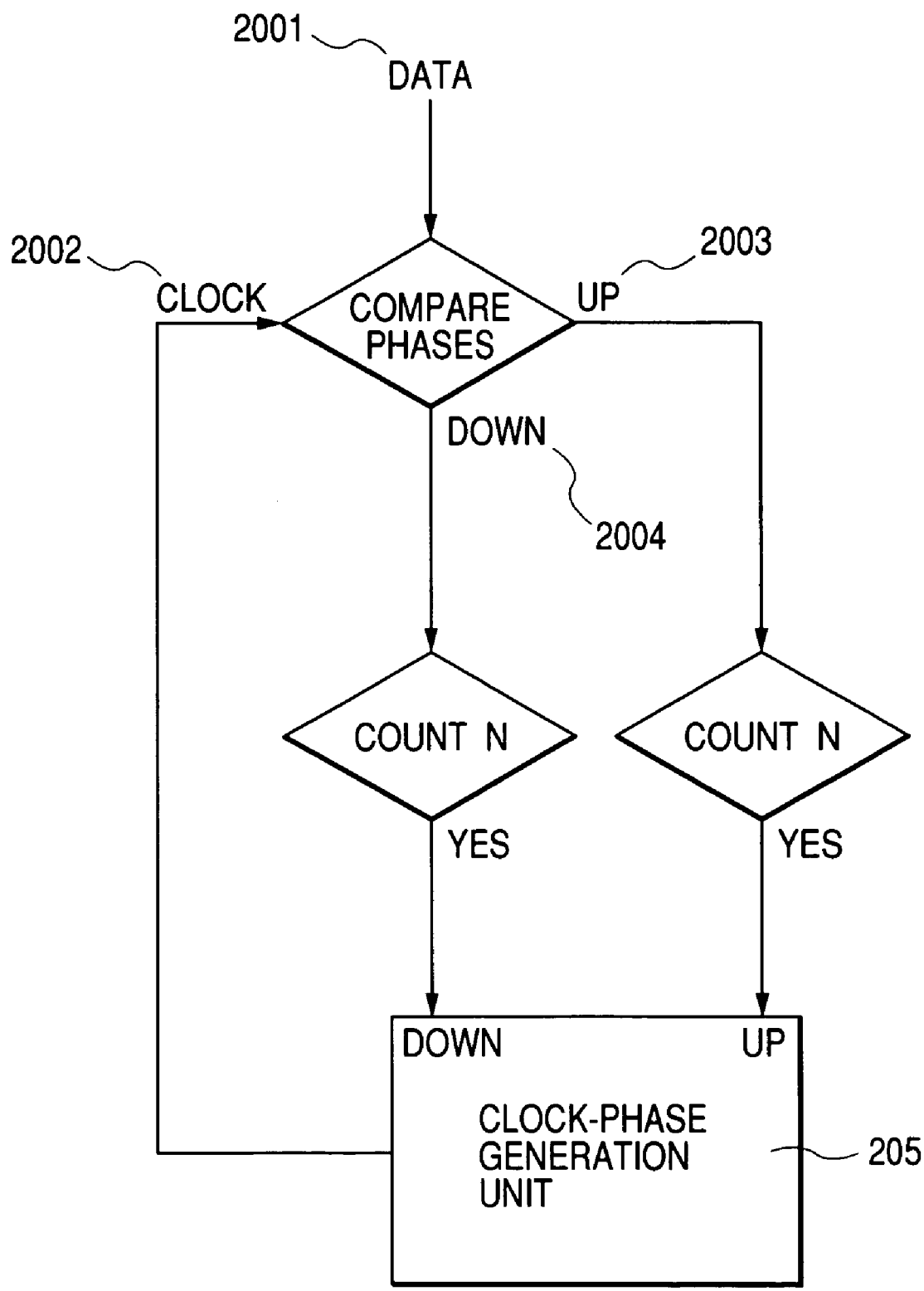
FIG. 20 shows a flowchart representing operations carried out by the CDR circuit given for a comparison purpose.
Figure 21:
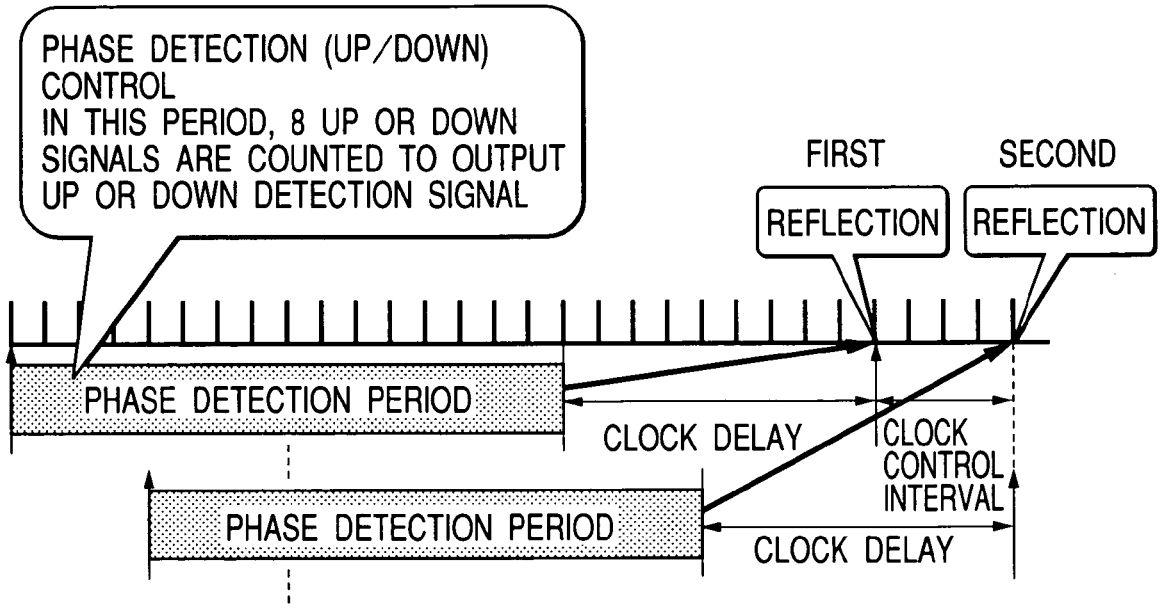
FIG. 21 is a diagram showing an outline of operations carried out by the CDR circuit given for a comparison purpose.
Figure 22:
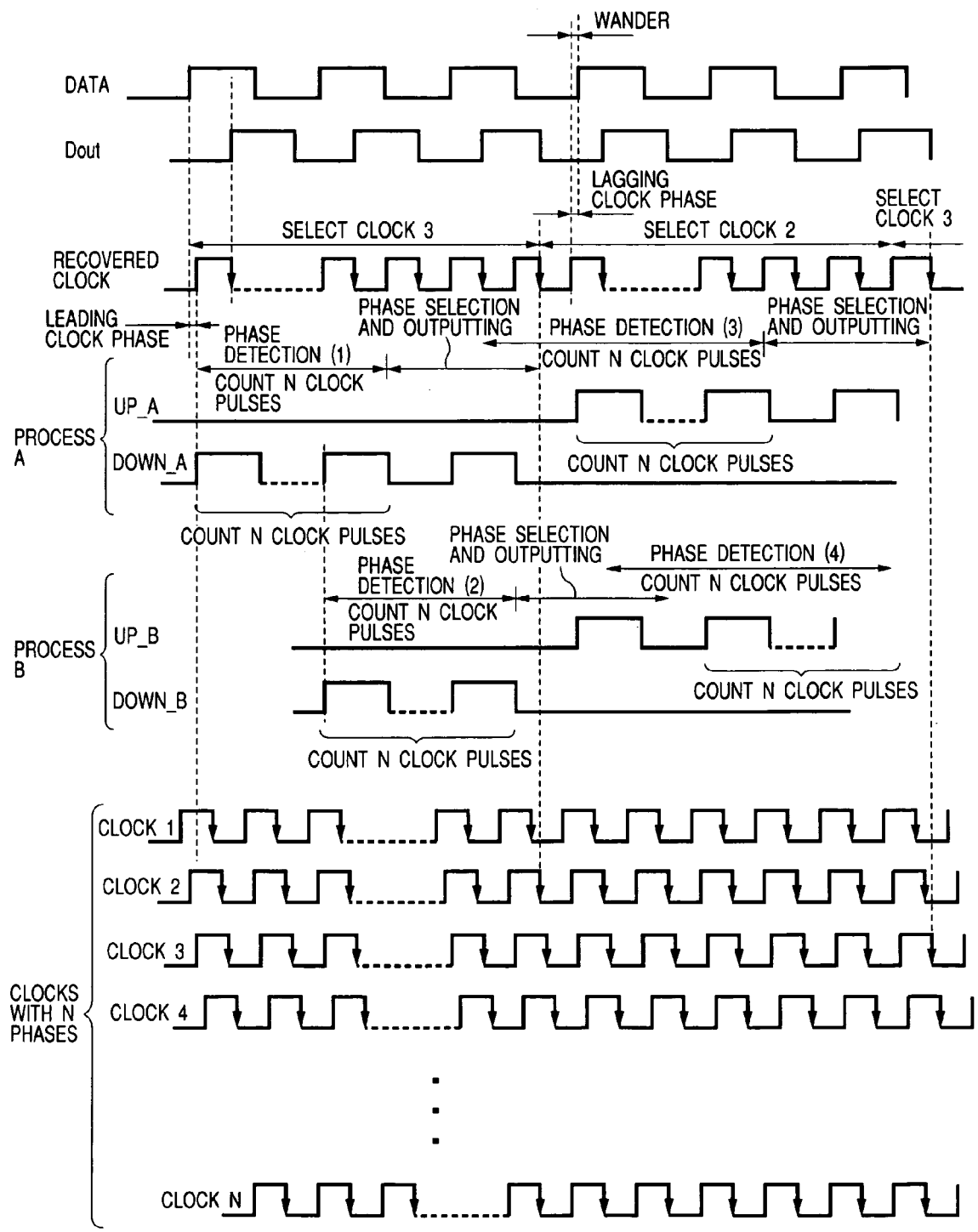
FIG. 22 shows typical timing charts of operations carried out by the CDR circuit given for a comparison purpose.
Figure 23:
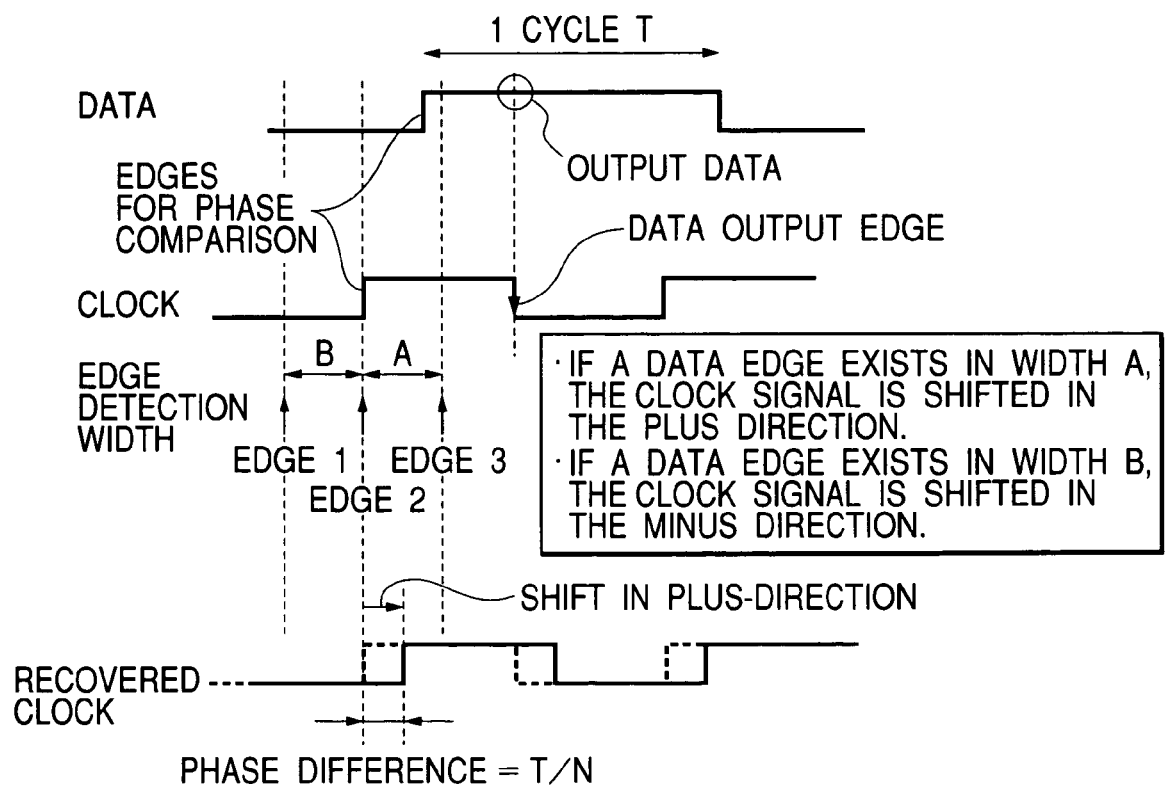
FIG. 23 is a diagram showing basic operations carried out by the CDR circuit given for a comparison purpose.
Figure 24:
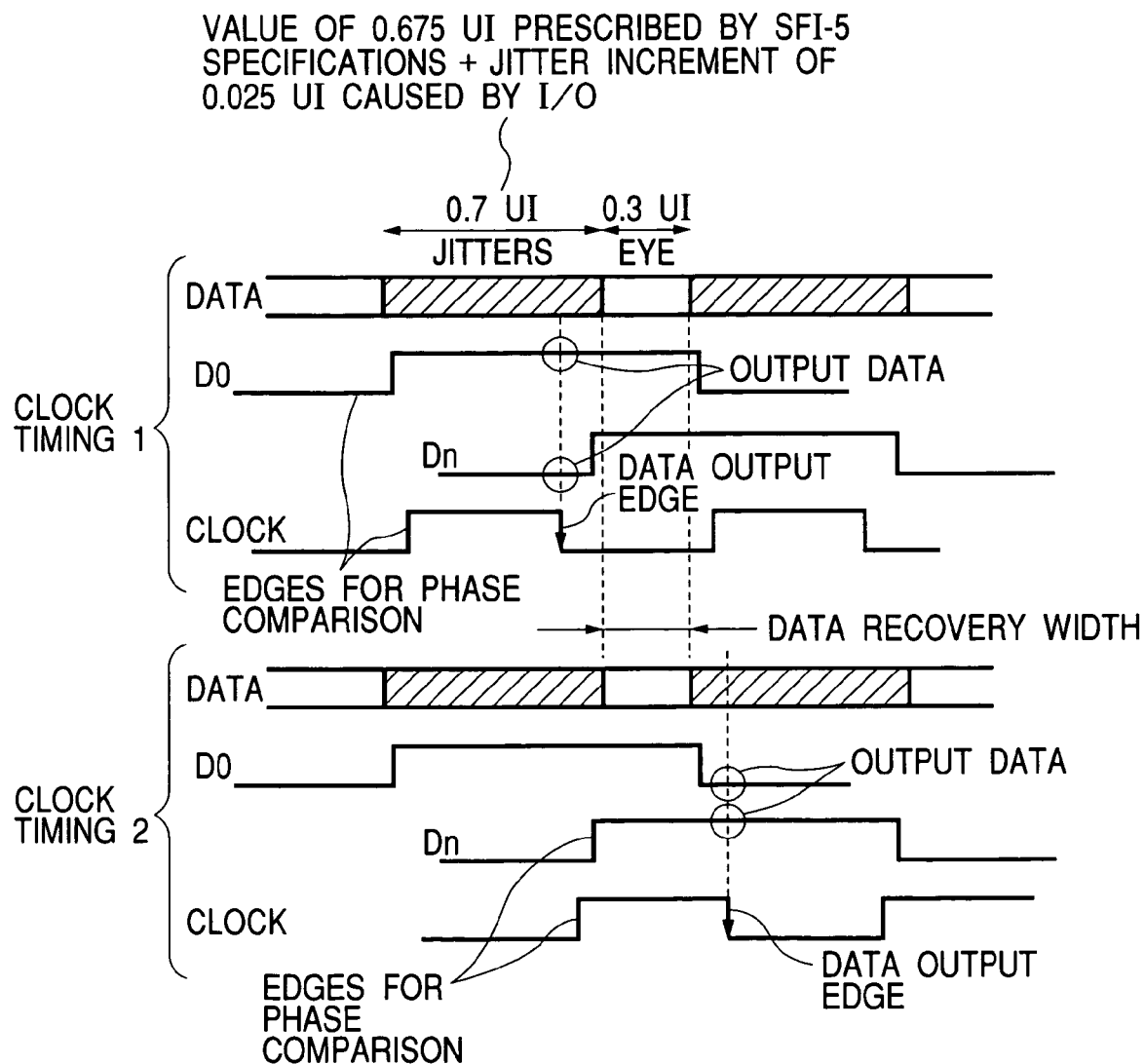
FIG. 24 is a diagram showing an edge detection method adopted by the CDR circuit given for a comparison purpose.
Figure 25:
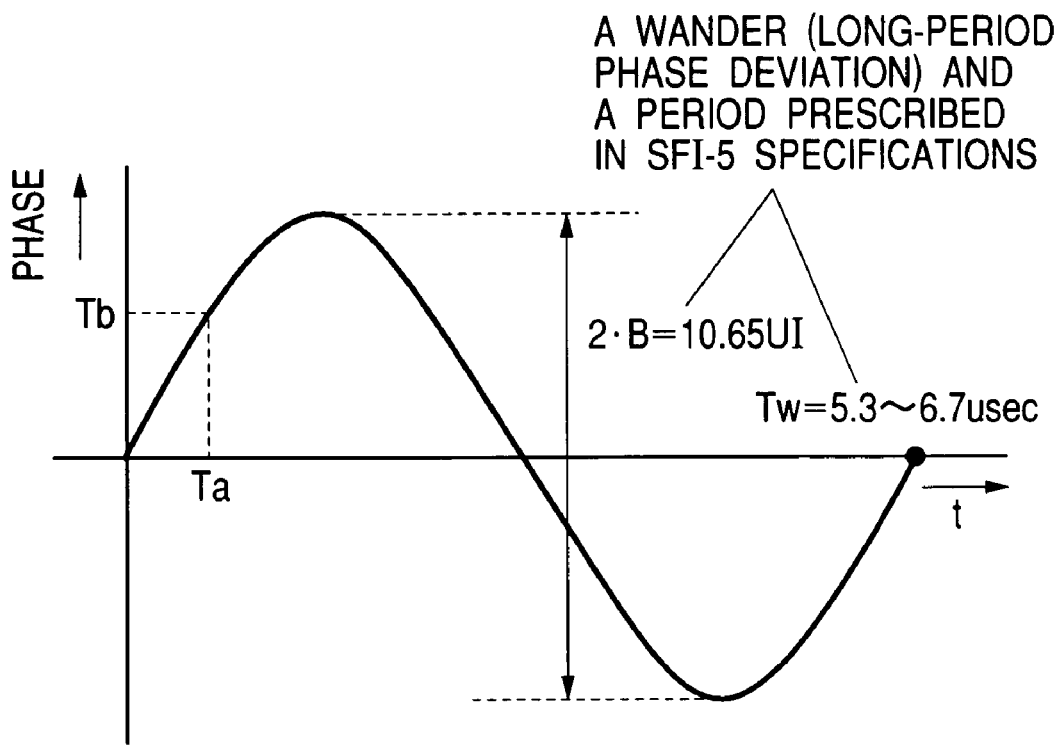
FIG. 25 is a diagram showing the definition of a wander.
Figure 26:
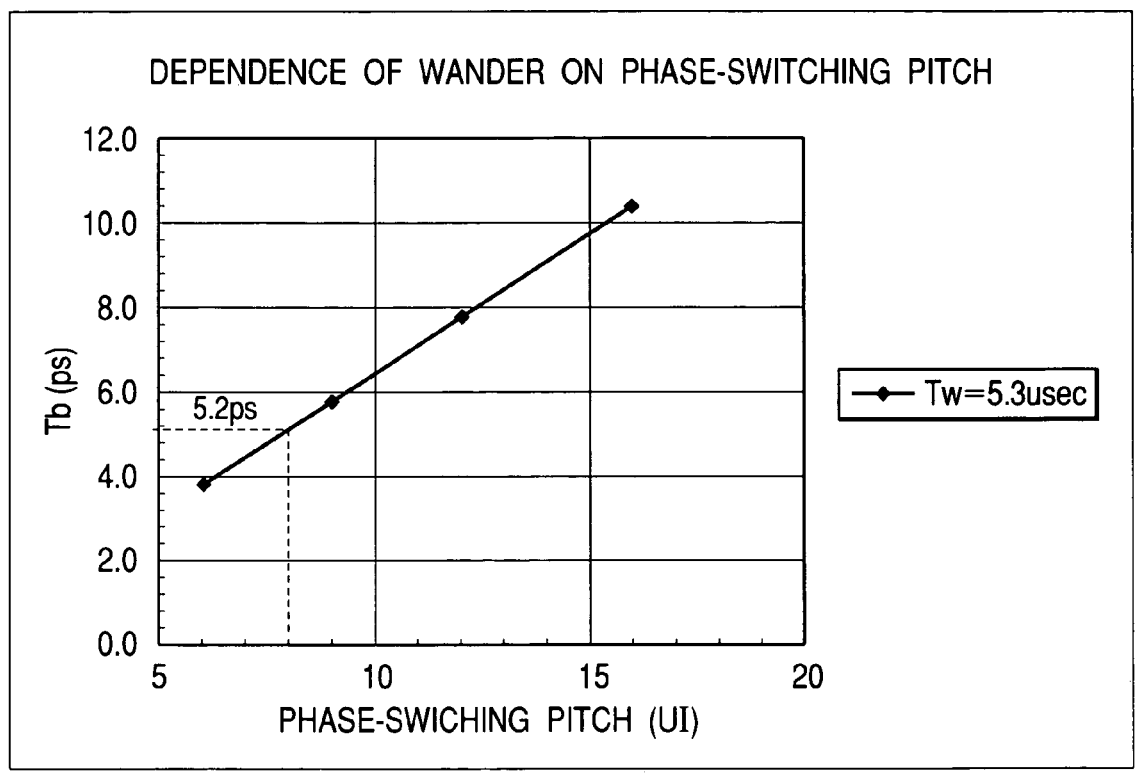
FIG. 26 is a diagram showing a characteristic representing dependence of a wander on a phase-switching pitch.
Figure 27:
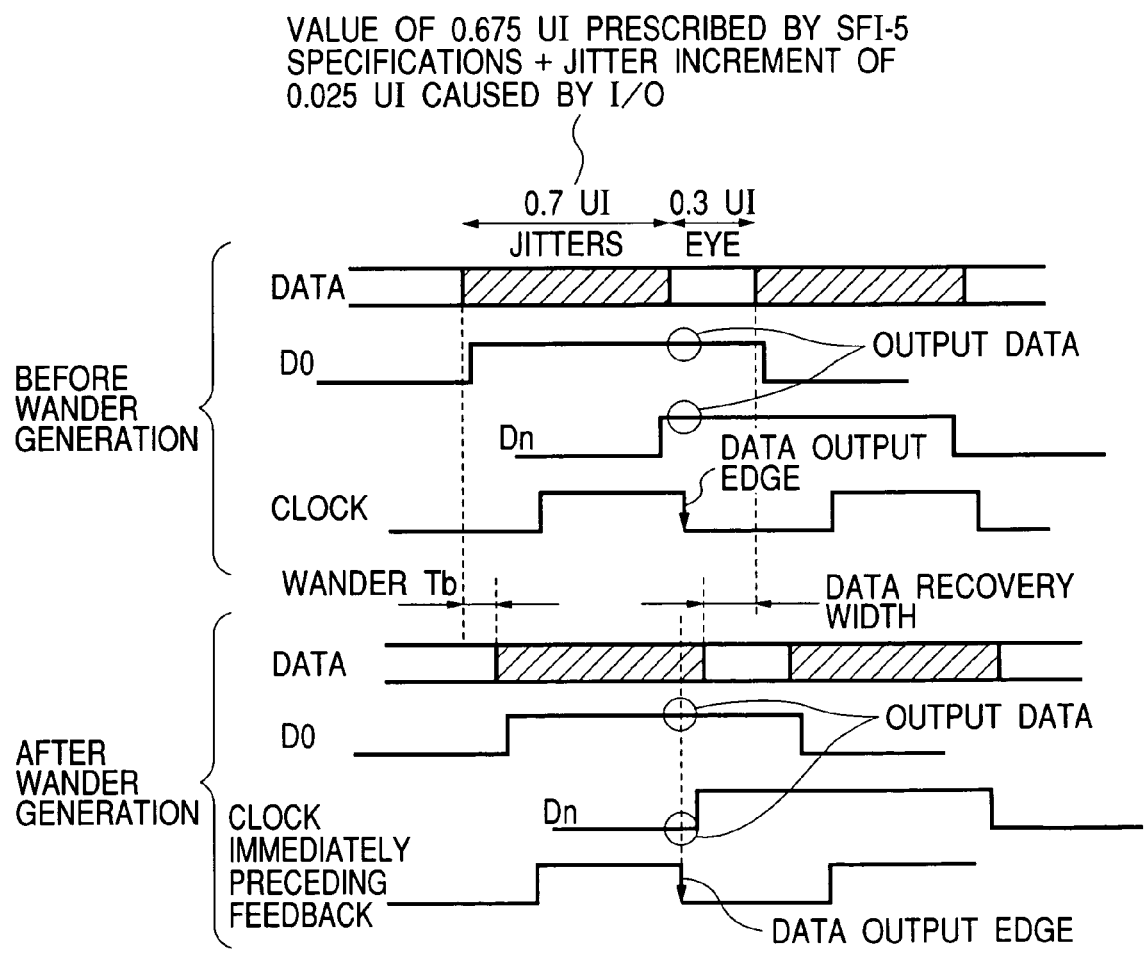
FIG. 27 is a diagram showing relations between an eye and clock jitters with a wander generated in the CDR circuit given for a comparison purpose.
Figure 28:
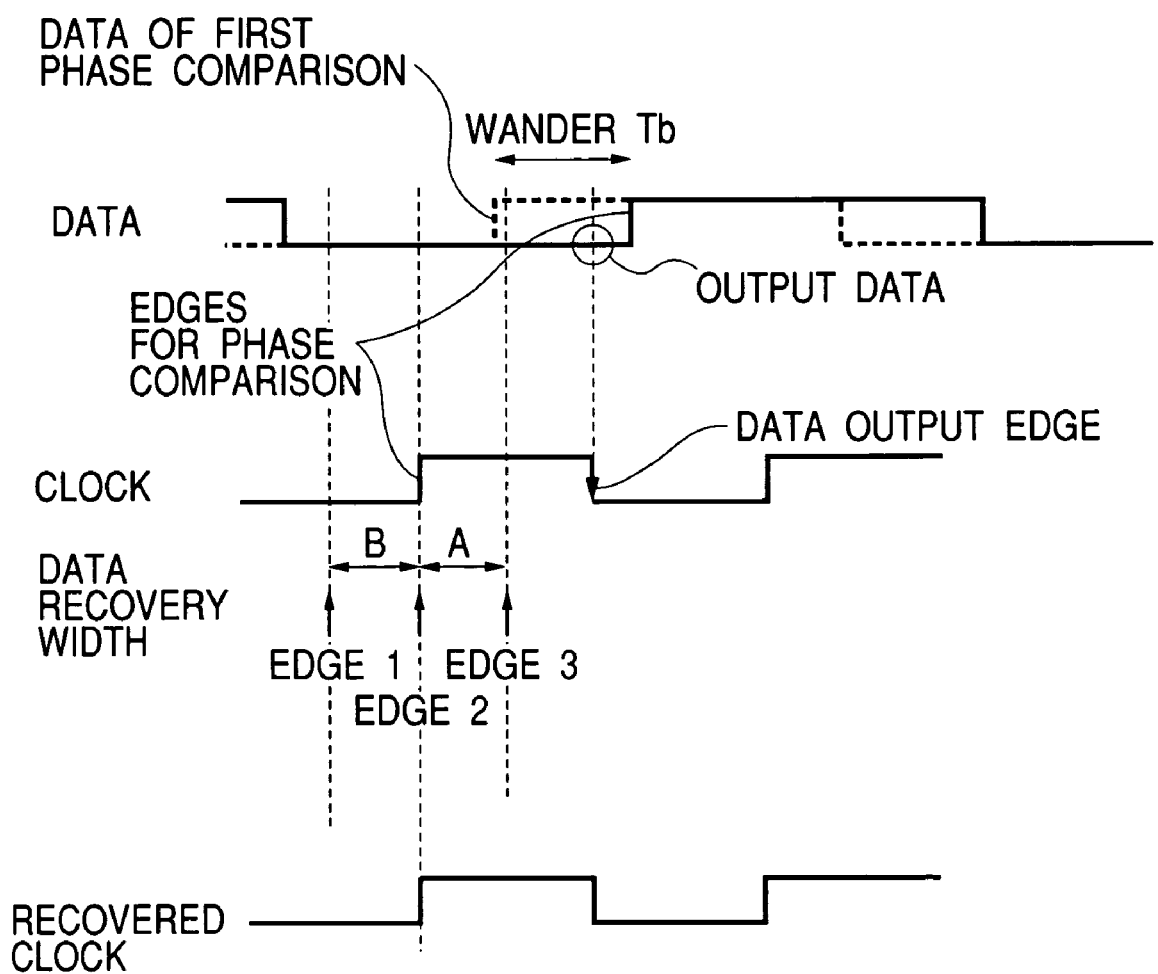
FIG. 28 is a diagram showing a relation between a data edge and an edge detection width with a wander generated in the CDR circuit given for a comparison purpose.

FIG. 15 is a block diagram showing the configuration of a digital clock data recovery circuit implemented by adopting a data delay method in accordance with a fourth embodiment of the present invention.

As shown in FIG. 15, the digital clock data recovery circuit comprises: a phase comparator 1503 for comparing the phase of input data 1501 with the phase of a data recovery clock signal 1502 generated internally and outputting a shift direction of the phase of the data recovery clock signal 1502 as UP and DOWN signals 1504; a register multi-stage connection OR logic type counter 1505 for controlling a frequency at which the UP and DOWN signals 1504 are fed back to a means for determining the phase of the data recovery clock signal 1502; and a clock-phase generation unit 1506 for generating an output phase of the data recovery clock signal on the basis of signals output by the counter 1505.

The clock-phase generation unit 1506 comprises a cyclic clock-phase pointer 1507 and a digital-control type phase variable-delay circuit 1508.

The method whereby the edge detection width is defined by edges of 3 signals having phases different from each other is changed to a method whereby data is delayed and the edge detection width is defined by edges of data having 3 phases. Thus, the recovered clock signal output by the phase variable-delay circuit 1508 is changed from 2 signals having phases different from each other to a signal having 1 phase. The phase variable-delay circuit 1508 includes a selector for selecting a clock signal from 16 clock signals having phases different from each other. Basic operations are the same as those of the digital-control type clock data recovery circuit implemented by the first embodiment of the present invention.

The fourth embodiment exhibits the same effects as those of the first embodiment. In addition, since the number of clock phases output by the phase variable-delay circuit 1508 is reduced, the circuit can be form with a single 8-1 selector and a single CMOS level conversion circuit so that the power consumption can be reduced to ½.

The Present invention can provide the effects as follows:

(1) The phase comparator compares the position of the edge of data with the position of the edge of a recovered clock signal and keeps the clock edge away from the data edge if a gap between the edges becomes smaller than a reference value so as to improve a jitter tolerance characteristic. In addition, a data recovery range in the event of a wander is broadened.

(2) A cycle of a reference clock signal is divided into N portions to generate N clock signals with phases different from each other. Then, the phase variable-delay circuit takes one of the N generated clock signals, which has a phase selected among the phases, as the data recovery clock signal. The fact that a phase switching quantity T/N limits a wander Tb in accordance with relation (1). indicates that the recovered signal's characteristic to track the wander is improved.

(3) The phase variable-delay circuit comprises composition circuits of the constant current generator type and 8-1 selectors, and execution of control to turn on 2 of 16 selector control signals supplied to each 2 adjacent pins of the 8-1 selectors at the same time reduces power consumption.

What is claimed is:

1. A digital-control type clock data recovery circuit comprising:
    a phase comparator comparing a phase of input data with a phase of a data recovery clock signal generated internally, outputting a DOWN signal to delay said data recovery clock signal when an edge of said input data is detected during a first term before said data recovery clock signal and outputting an UP signal to set forward the phase of said data recovery clock signal when an edge of said input data is detected during a second term after said data recovery clock signal;
    a multistage register circuit storing onset of said DOWN signal and onset of said UP signal at each of comparing opportunities during a phase detection period corresponding to a plurality of cycles of said data recovery clock signal, generating an OUT DOWN signal if at least one DOWN signal is stored at an end of the phase detection period and generating an OUT UP signal if at least one UP signal is stored at the end of the phase detection period; and
    a clock-phase generation unit generating said data recovery clock signal and shifting the phase of said data recovery clock signal on the basis of the OUT UP signal and the OUT DOWN signal output from said multistage register circuit so as to separate edges of said data recovery clock signal away from edges of said input data by a predetermined time gap;
    wherein said input data is taken in with a timing of said data recovery clock signal.

2. A digital-control type clock data recovery circuit according to claim 1, wherein said clock-phase generation unit includes a phase variable delay circuit for generating N clock signals with phases different from each other on the basis of a reference clock signal, and for selecting one of said N clock signals in accordance with a phase selection signal, where N is a finite number, and a cyclic clock phase pointer setting and changing said phase selection signal in accordance with the OUT UP signal and the OUT DOWN signal.

3. A digital-control type clock data recovery circuit according to claim 2, wherein said phase variable-delay circuit comprises a buffer, a composition circuit, an N−1 selector and a CMOS level conversion circuit, and said buffer, said composition circuit, said N−1 selector and said CMOS level conversion circuit are each designed as a small-amplitude differential circuit.

4. A digital-control type clock data recovery circuit according to claim 3, wherein, by executing control to turn on 2 of N selector control signals supplied to each 2 adjacent pins of said N−1 selector at the same time, said N−1 selector is capable of generating a middle phase between first and second phases and, hence, obtaining N×2 phases from N input phases.

5. A digital-control type clock data recovery circuit comprising:
    comparing circuitry containing a function to track a wander of input data by comparing a position of an edge of said input data with a position of an edge of a clock signal,
    wherein said function to track a wander of input data by comparing a position of an edge of said input data with a position of an edge of a clock signal is executed under a condition expressed by a relation given as follows:

$$B \times \sin(2\pi \times Ta/Tw) < T/N$$

where symbol B denotes a maximum phase change of said input data over a period of time, symbol Ta denotes a loop delay, which is a period of time between an output operation carried out by a counter and a first phase comparison, symbol Tw denotes a phase deviation period, symbol T denotes a clock period, symbol N denotes the number of phase divisions, where N is a finite number, and T/N denotes a difference between 2 adjacent phases determined by said number of phase divisions N.

* * * * *